(12) United States Patent
Park et al.

(10) Patent No.: US 12,531,026 B2
(45) Date of Patent: Jan. 20, 2026

(54) DISPLAY DEVICE

(71) Applicant: SAMSUNG DISPLAY CO., LTD., Yongin-si (KR)

(72) Inventors: Heejean Park, Suwon-si (KR); Heerim Song, Seoul (KR); Yujin Lee, Suwon-si (KR); Cheol-Gon Lee, Suwon-si (KR); Mukyung Jeon, Ulsan (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/966,112

(22) Filed: Dec. 2, 2024

(65) Prior Publication Data

US 2025/0095583 A1  Mar. 20, 2025

Related U.S. Application Data

(63) Continuation of application No. 18/102,563, filed on Jan. 27, 2023, now Pat. No. 12,159,580.

(30) Foreign Application Priority Data

Apr. 7, 2022 (KR) .................. 10-2022-0043408

(51) Int. Cl.
```
G09G 3/3233    (2016.01)
G06F 3/044     (2006.01)
G06V 40/13     (2022.01)
```

(52) U.S. Cl.
CPC .......... *G09G 3/3233* (2013.01); *G06F 3/044* (2013.01); *G06V 40/1318* (2022.01); *G09G 2300/0819* (2013.01); *G09G 2300/0842* (2013.01); *G09G 2300/0861* (2013.01); *G09G 2310/08* (2013.01); *G09G 2354/00* (2013.01)

(58) Field of Classification Search
None
See application file for complete search history.

(56) References Cited

U.S. PATENT DOCUMENTS

| | | | |
|---|---|---|---|
| 10,727,285 B2 | 7/2020 | Chung et al. | |
| 11,158,258 B2 | 10/2021 | Cha et al. | |
| 11,437,459 B2 | 9/2022 | Lee et al. | |
| 2020/0311373 A1 | 10/2020 | Lee et al. | |
| 2022/0005408 A1* | 1/2022 | Choi | G09G 3/3208 |
| 2022/0299813 A1* | 9/2022 | Abe | G02F 1/13338 |

FOREIGN PATENT DOCUMENTS

| | | |
|---|---|---|
| KR | 10-2019-0081730 A | 7/2019 |
| KR | 10-2020-0082662 A | 7/2020 |
| KR | 10-2020-0115832 A | 10/2020 |
| KR | 10-2021-0064483 A | 6/2021 |
| KR | 10-2021-0101347 A | 8/2021 |

\* cited by examiner

*Primary Examiner* — Christopher J Kohlman
(74) *Attorney, Agent, or Firm* — Womble Bond Dickinson (US) LLP

(57) ABSTRACT

A display device includes: a base layer; a plurality of scan lines configured to sequentially receive scan signals, the plurality of scan lines being on the base layer; a plurality of pixels on the base layer and connected to each of the plurality of scan lines; a plurality of sensing control lines configured to simultaneously receive sensing control signals, the sensing control lines being on the base layer; and a plurality of sensors on the base layer and connected to respective ones of the sensing control lines, wherein the scan line and the sensing control line are on the same layer.

19 Claims, 19 Drawing Sheets

DISPLAY DEVICE

CROSS-REFERENCE TO RELATED APPLICATIONS

This application is a continuation of U.S. patent application Ser. No. 18/102,563, filed Jan. 27, 2023, which claims priority to and the benefit of Korean Patent Application No. 10-2022-0043408, filed Apr. 7, 2022, the entire content of both of which is incorporated herein by reference.

BACKGROUND

1. Field

Aspects of some embodiments of the present disclosure described herein relate to a display device.

2. Description of Related Art

A display device provides various functions for communication with users. For example, the display device may display images to provide information to the user, or may sense an input of the user. Recent display devices include a function of sensing biometric information of a user.

Biometric information may be recognized, for example, by using a capacitive sensing technique for sensing a change in capacitance formed between electrodes, a light sensing technique for sensing incident light using an optical sensor, or an ultrasonic sensing technique for sensing vibration using a piezoelectric element.

The above information disclosed in this Background section is only for enhancement of understanding of the background and therefore the information discussed in this Background section does not necessarily constitute prior art.

SUMMARY

Aspects of some embodiments of the present disclosure described herein relate to a display device, and for example, relate to a display device capable of biometric information recognition.

Aspects of some embodiments of the present disclosure include a display device having relatively improved sensing performance of a sensor for biometric information recognition.

According to some embodiments, a display device includes a base layer, a plurality of scan lines to which a scan signal is sequentially supplied, the plurality of scan lines being on the base layer, and a plurality of pixels on the base layer and connected to each of the plurality of scan lines. The display device includes a plurality of sensing control lines to which a sensing control signal is simultaneously supplied, the sensing control lines being on the base layer, and a plurality of sensors on the base layer and connected to each of the sensing control lines. The scan line and the sensing control line are on the same layer.

According to some embodiments of the present disclosure, each of the pixels may include a light emitting element and a pixel drive circuit that is on the base layer and electrically connected with the light emitting element and that receives the scan signal through the scan line. Each of the sensors may include a light sensing unit and a sensor drive circuit that is on the base layer and electrically connected with the light sensing unit and that receives the sensing control signal through the sensing control line.

According to some embodiments of the present disclosure, the sensor drive circuit may include a reset transistor including a first electrode connected with a reset receiving line that receives a reset voltage, a second electrode connected with a first sensing node, and a third electrode connected with the sensing control line. The sensor drive circuit may include an amplifying transistor including a first electrode connected with a sensing drive line that receives a sensing drive voltage, a second electrode connected with a second sensing node, and a third electrode connected with the first sensing node. The sensor drive circuit may include an output transistor including a first electrode connected with the second sensing node, a second electrode connected with a sensing line, and a third electrode connected with an output control line that receives an output control signal.

According to some embodiments of the present disclosure, the pixel drive circuit may include a drive transistor including a first electrode connected with a first drive voltage line that receives a first drive voltage, a second electrode connected with the light emitting element, and a third electrode connected with a first reference node. The pixel drive circuit may include a switching transistor including a first electrode connected with a data line that receives a data signal, a second electrode connected with the first electrode of the drive transistor, and a third electrode connected with a write scan line that receives a write scan signal. The pixel drive circuit may include a compensation transistor including a first electrode connected with the second electrode of the drive transistor, a second electrode connected with the first reference node, and a third electrode connected with a compensation scan line that receives a compensation scan signal.

According to some embodiments of the present disclosure, the scan signal may include the compensation scan signal, and the plurality of scan lines may include the compensation scan line.

According to some embodiments of the present disclosure, each of the reset transistor and the compensation transistor may be an oxide semiconductor.

According to some embodiments of the present disclosure, the pixel drive circuit may further include an initialization transistor including a first electrode connected with the first reference node, a second electrode connected with an initialization line that receives an initialization voltage, and a third electrode connected with an initialization scan line that receives an initialization scan signal.

According to some embodiments of the present disclosure, the scan signal may include the initialization scan signal, and the plurality of scan lines may include the initialization scan line.

According to some embodiments of the present disclosure, each of the reset transistor and the initialization transistor may be an oxide semiconductor.

According to some embodiments of the present disclosure, the output control line may be electrically connected with the write scan line, and the output control signal may be the same signal as the write scan signal.

According to some embodiments of the present disclosure, the scan line and the sensing control line may extend in a first direction and may be spaced apart from each other in a second direction crossing the first direction.

According to some embodiments of the present disclosure, the reset receiving line may extend in the first direction and may be on a different layer from the scan line and the sensing control line.

According to some embodiments of the present disclosure, the reset receiving line may include a first reset line that extends in the first direction and a second reset line that is electrically connected with the first reset line and that extends in the second direction. The first reset line may be on the same layer as the first drive voltage line, and the second reset line may be on the same layer as the data line.

According to some embodiments of the present disclosure, the light sensing unit may include k light sensing elements. Each of the k light sensing elements may include a first anode electrode, a photoelectric conversion layer on the first anode electrode, and a first cathode electrode on the photoelectric conversion layer. The sensor drive circuit may be directly connected to the first anode electrode of one light sensing element, and k may be a natural number of 2 or larger.

According to some embodiments of the present disclosure, each of the sensors may further include a routing wire that electrically connects the k light sensing elements. The routing wire may electrically connect k anode electrodes of the k light sensing elements to each other.

According to some embodiments of the present disclosure, the light emitting element may include a second anode electrode electrically connected with the second electrode of the drive transistor, a light emitting layer on the second anode electrode, and a second cathode electrode on the light emitting layer. The second cathode electrode may be electrically connected with first cathode electrodes of the k light sensing elements, and the first anode electrode of the one light sensing element may be directly connected with the first sensing node.

According to some embodiments, a display device includes a base layer, a plurality of first scan lines to which a first scan signal is sequentially supplied, the first scan lines being on the base layer, and a plurality of second scan lines to which a second scan signal is sequentially supplied, the second scan lines being on the base layer. The display device includes a pixel drive circuit that is on the base layer and that includes a first transistor electrically connected with each of the first scan lines and implemented with a silicon semiconductor and a second transistor electrically connected with each of the second scan lines and implemented with an oxide semiconductor, and a light emitting element electrically connected with the pixel drive circuit. The display device includes a plurality of sensing control lines to which a sensing control signal is simultaneously supplied, the sensing control lines being on the base layer, a sensor drive circuit that is on the base layer and electrically connected with each of the sensing control lines and that includes a third transistor including an oxide transistor, and a light sensing unit electrically connected with the sensor drive circuit. The first scan line and the sensing control line are on the same layer.

According to some embodiments of the present disclosure, the sensor drive circuit may include a reset transistor including a first electrode connected with a reset receiving line that receives a reset voltage, a second electrode connected with a first sensing node, and a third electrode connected with the sensing control line. The sensor drive circuit may include an amplifying transistor including a first electrode connected with a sensing drive line that receives a sensing drive voltage, a second electrode connected with a second sensing node, and a third electrode connected with the first sensing node. The sensor drive circuit may include an output transistor including a first electrode connected with the second sensing node, a second electrode connected with a sensing line, and a third electrode connected with an output control line that receives an output control signal. The third transistor may include the reset transistor.

According to some embodiments of the present disclosure, each of the amplifying transistor and the output transistor may be a silicon semiconductor.

According to some embodiments of the present disclosure, the pixel drive circuit may include a drive transistor including a first electrode connected with a first drive voltage line that receives a first drive voltage, a second electrode connected with the light emitting element, and a third electrode connected with a first reference node. The pixel drive circuit may include a switching transistor including a first electrode connected with a data line that receives a data signal, a second electrode connected with the first electrode of the drive transistor, and a third electrode connected with a write scan line that receives a write scan signal. The pixel drive circuit may include a compensation transistor including a first electrode connected with the second electrode of the drive transistor, a second electrode connected with the first reference node, and a third electrode connected with a compensation scan line that receives a compensation scan signal. The pixel drive circuit may include an initialization transistor including a first electrode connected with the first reference node, a second electrode connected with an initialization line that receives an initialization voltage, and a third electrode connected with an initialization scan line that receives an initialization scan signal. The first transistor may include the drive transistor and the switching transistor. The first scan signal may include the write scan signal, and the plurality of first scan lines may include the write scan line. The second transistor may include the compensation transistor and the initialization transistor. The plurality of second scan signals may include the compensation scan signal and the initialization scan signal, and the plurality of second scan lines may include the compensation scan line and the initialization scan line.

BRIEF DESCRIPTION OF THE DRAWINGS

The above and other objects and features of the present disclosure will become apparent by describing in more detail aspects of some embodiments thereof with reference to the accompanying drawings.

DETAILED DESCRIPTION

Figure 1:
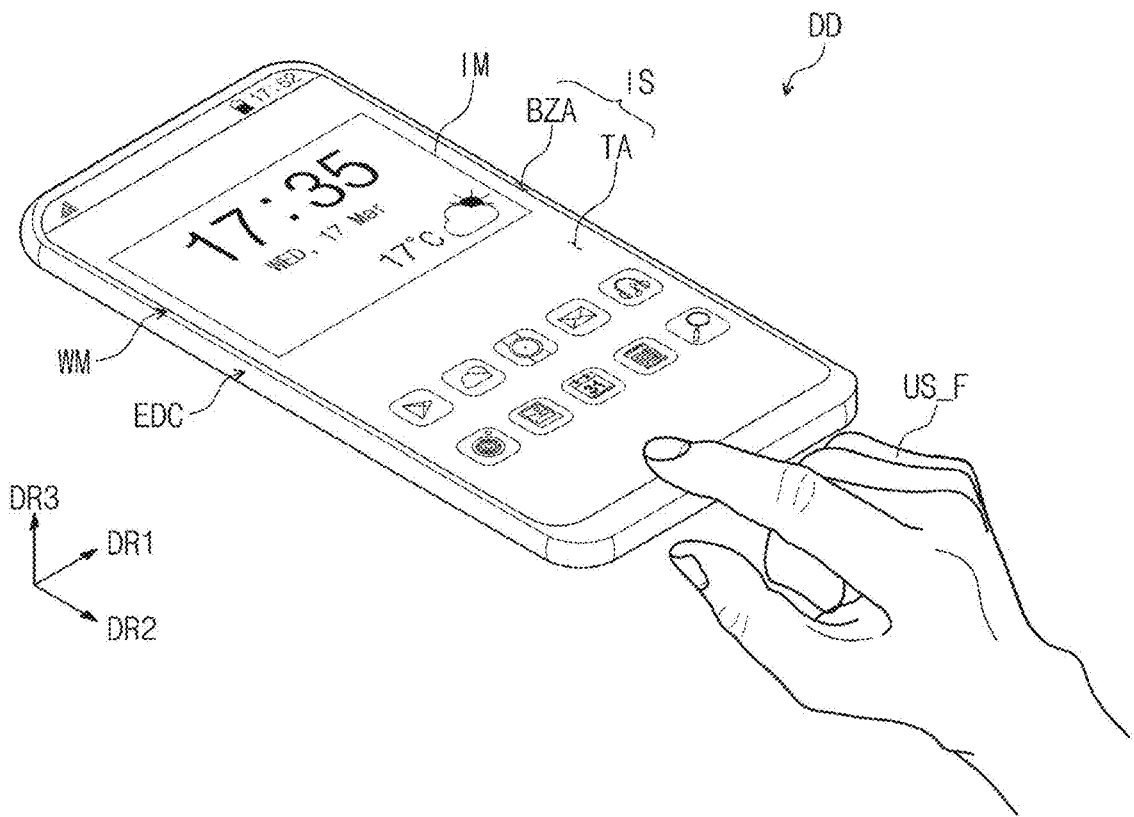
FIG. 1 is a perspective view of a display device according to some embodiments of the present disclosure.

In this specification, when it is mentioned that a component (or, an area, a layer, a part, etc.) is referred to as being "on", "connected to" or "coupled to" another component, this means that the component may be directly on, connected to, or coupled to the other component or a third component may be present therebetween.

Identical reference numerals refer to identical components. Additionally, in the drawings, the thicknesses, proportions, and dimensions of components are exaggerated for effective description. As used herein, the term "and/or" includes all of one or more combinations defined by related components.

Terms such as first, second, and the like may be used to describe various components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, embodiments of the present disclosure will be described with reference to the accompanying drawings.

Figure 2:
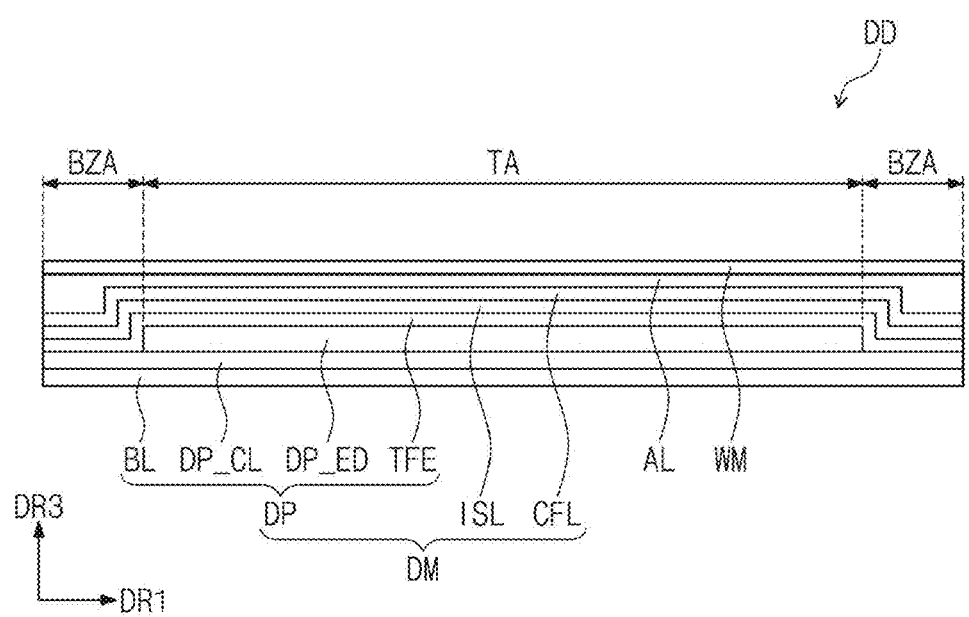
FIG. 2 is a sectional view of the display device according to some embodiments of the present disclosure.

FIG. 1 is a perspective view of a display device according to some embodiments of the present disclosure. FIG. 2 is a sectional view of the display device according to some embodiments of the present disclosure.

Referring to FIGS. 1 and 2, the display device DD according to some embodiments of the present disclosure may have a rectangular shape with long sides parallel to a second direction DR2 and short sides parallel to a first direction DR1 crossing the second direction DR2. However, without being limited thereto, the display device DD may have various shapes such as a circular shape, a polygonal shape, and the like.

The display device DD may be a device activated in response to an electrical signal. The display device DD may include various embodiments. For example, the display device DD may be applied to an electronic device such as a smart watch, a tablet computer, a notebook computer, a computer, a smart television, or the like.

Hereinafter, a normal direction substantially perpendicular to a plane defined by the first direction DR1 and the second direction DR2 is defined as a third direction DR3. As used herein, the expression "when viewed on the plane" or "in a plan view" may mean that it is viewed in the third direction DR3.

An upper surface of the display device DD may be defined as a display surface IS and may be parallel to the plane defined by the first direction DR1 and the second direction DR2. Images IM generated by the display device DD may be displayed to a user through the display surface IS.

The display surface IS may be divided into a transmissive area TA and a bezel area BZA. The transmissive area TA may be an area where the images IM are displayed. The user visually recognizes the images IM through the transmissive area TA. According to some embodiments, the transmissive area TA is illustrated in a rounded rectangular shape. However, this is illustrative, and the transmissive area TA may have various shapes and is not limited to any one embodiment.

The bezel area BZA is adjacent to the transmissive area TA. The bezel area BZA may have a color (e.g., a set or predetermined color). The bezel area BZA may surround the transmissive area TA. Accordingly, the shape of the transmissive area TA may be substantially defined by the bezel area BZA. However, this is illustrative, and the bezel area BZA may be located adjacent to only one side of the transmissive area TA, or may be omitted.

The display device DD may sense an external input applied from the outside. The external input may include various forms of inputs provided from outside the display device DD. For example, the external input may include not only contact by a body part such as a hand US_F of the user or contact by a separate device (e.g., a touch pen or an active pen) but also an external input (e.g., hovering) that is applied in proximity to the display device DD or applied adjacent to the display device DD at a distance (e.g., a set or predetermined distance). Furthermore, the external input may have various forms such as force, pressure, temperature, light, and the like.

The display device DD may sense the user's biometric information applied from the outside. A biometric information sensing area capable of sensing the user's biometric information may be provided on the display surface IS of the display device DD. The biometric information sensing area may be provided in the entire region of the transmissive area TA, or may be provided in a partial region of the transmissive area TA. FIG. 1 illustrates one example that the entire transmissive area TA is used as the biometric information sensing area.

The display device DD may include a window WM, a display module DM, and a housing EDC. According to some embodiments, the window WM and the housing EDC are coupled to form the exterior of the display device DD.

The front surface of the window WM defines the display surface IS of the display device DD. The window WM may be formed of a transparent material through which the images IM are able to be output. The window WM may contain an optically clear insulating material. For example, the window WM may contain glass or plastic. The window WM may have a multi-layer structure or a single-layer structure. For example, the window WM may include a plurality of plastic films coupled through an adhesive, or may include a glass substrate and a plastic film coupled through an adhesive.

The display module DM may include a display panel DP and an input sensing layer ISL. The display panel DP may display the images IM in response to an electrical signal, and the input sensing layer ISL may sense an external input applied from the outside. The external input may be provided in various forms.

The display panel DP according to some embodiments of the present disclosure may be an emissive display panel, but is not particularly limited. For example, the display panel DP may be an organic light emitting display panel, an inorganic light emitting display panel, or a quantum-dot light emitting display panel. An emissive layer of the organic light emitting display panel may contain an organic light emitting material, and an emissive layer of the inorganic light emitting display panel may contain an inorganic light emitting material. An emissive layer of the quantum-dot light emitting display panel may contain quantum dots or quantum rods. Hereinafter, the display panel DP will be described in the context of an organic light emitting display panel, but embodiments according to the present disclosure are not limited thereto.

Referring to FIGS. 1 and 2, the display device DD may include the display module DM and the window WM. The display module DM includes the display panel DP and the input sensing layer ISL. The display panel DP includes a base layer BL, a circuit layer DP_CL, an element layer DP_ED, and an encapsulation layer TFE. The display panel DP according to the present disclosure may be a flexible display panel. However, embodiments according to the present disclosure are not limited thereto. For example, the display panel DP may be a foldable display panel that is folded about a folding axis, or a rigid display panel.

The base layer BL may include a synthetic resin layer. The synthetic resin layer may be a polyimide-based resin layer, and the material thereof is not particularly limited. In addition, the base layer BL may include a glass substrate, a metal substrate, or an organic/inorganic composite substrate.

The circuit layer DP_CL is located between the base layer BL and the element layer DP_ED. The circuit layer DP_CL includes at least one insulating layer and a circuit element. Hereinafter, the insulating layer included in the circuit layer DP_CL is referred to as the intermediate insulating layer. The intermediate insulating layer includes at least one intermediate inorganic film and at least one intermediate organic film. The circuit element may include a pixel drive circuit included in each of a plurality of pixels PX (refer to FIG. 3) for displaying the images IM and a sensor drive circuit O_SD (refer to FIG. 5A) included in each of a plurality of sensors FX (refer to FIG. 3) for recognizing external information. The external information may be biometric information. According to some embodiments of the present disclosure, the sensors FX may include a fingerprint recognition sensor, a proximity sensor, an iris recognition sensor, and the like. Furthermore, the sensors may include an optical sensor for recognizing biometric information in an optical manner.

The circuit layer DP_CL may further include signal lines connected to the pixel drive circuit and/or the sensor drive circuit.

The element layer DP_ED may include a light emitting element included in each of the pixels and a light sensing element included in each of the sensors. According to some embodiments of the present disclosure, the light sensing element may be a photo diode. The light sensing element may be a sensor that senses, or reacts to, light reflected by a fingerprint of the user. The circuit layer DP_CL and the element layer DP_ED will be described below in more detail with reference to FIGS. 9 to 11B.

The encapsulation layer TFE encapsulates the element layer DP_ED. The encapsulation layer TFE may include at least one organic film and at least one inorganic film. The inorganic film may contain an inorganic material and may protect the element layer DP_ED from moisture/oxygen. The inorganic film may include, but is not particularly limited to, a silicon nitride layer, a silicon oxy-nitride layer, a silicon oxide layer, a titanium oxide layer, or an aluminum oxide layer. The organic film may contain an organic material and may protect the element layer DP_ED from foreign matter such as dust particles.

The input sensing layer ISL may be formed on the display panel DP. The input sensing layer ISL may be directly located on the encapsulation layer TFE. According to some embodiments of the present disclosure, the input sensing layer ISL may be formed on the display panel DP by a continuous process. That is, when the input sensing layer ISL is directly located on the display panel DP, an adhesive film is not located between the input sensing layer ISL and the encapsulation layer TFE. Alternatively, an adhesive film may be located between the input sensing layer ISL and the display panel DP. In this case, the input sensing layer ISL may not be manufactured together with the display panel DP by a continuous process and may be manufactured separately from the display panel DP and then fixed to the upper surface of the display panel DP by the adhesive film.

The input sensing layer ISL may sense an external input (e.g., a touch of the user), may change the sensed external input to an input signal (e.g., a set or predetermined input signal), and may provide the input signal to the display panel DP. The input sensing layer ISL may include a plurality of sensing electrodes for sensing the external input. The sensing electrodes may sense the external input in a capacitive manner. The display panel DP may receive the input signal from the input sensing layer ISL and may generate an image corresponding to the input signal.

The display module DM may further include a color filter layer CFL. According to some embodiments of the present disclosure, the color filter layer CFL may be located on the input sensing layer ISL. However, embodiments according to the present disclosure are not limited thereto. The color filter layer CFL may be located between the display panel DP and the input sensing layer ISL. The color filter layer CFL may include a plurality of color filters and a black matrix.

The structures of the input sensing layer ISL and the color filter layer CFL will be described below in more detail with reference to FIGS. 11A and 11B.

The display device DD according to some embodiments of the present disclosure may further include an adhesive layer AL. The window WM may be attached to the input sensing layer ISL by the adhesive layer AL. The adhesive layer AL may include an optically clear adhesive, an optically clear adhesive resin, or a pressure sensitive adhesive (PSA).

The housing EDC may be coupled with the window WM to define the exterior of the display device DD. The housing EDC is coupled with the window WM to provide an inner space (e.g., a set or predetermined inner space). The display module DM may be accommodated in the inner space. The housing EDC may contain a material having a relatively high stiffness. For example, the housing EDC may contain glass, plastic, or metal, or may include a plurality of frames and/or plates formed of a combination of the mentioned materials. The housing EDC may stably protect components of the display device DD accommodated in the inner space from an external impact. According to some embodiments, a battery module for supplying power required for overall operation of the display device DD may be located between the display module DM and the housing EDC.

Figure 3:
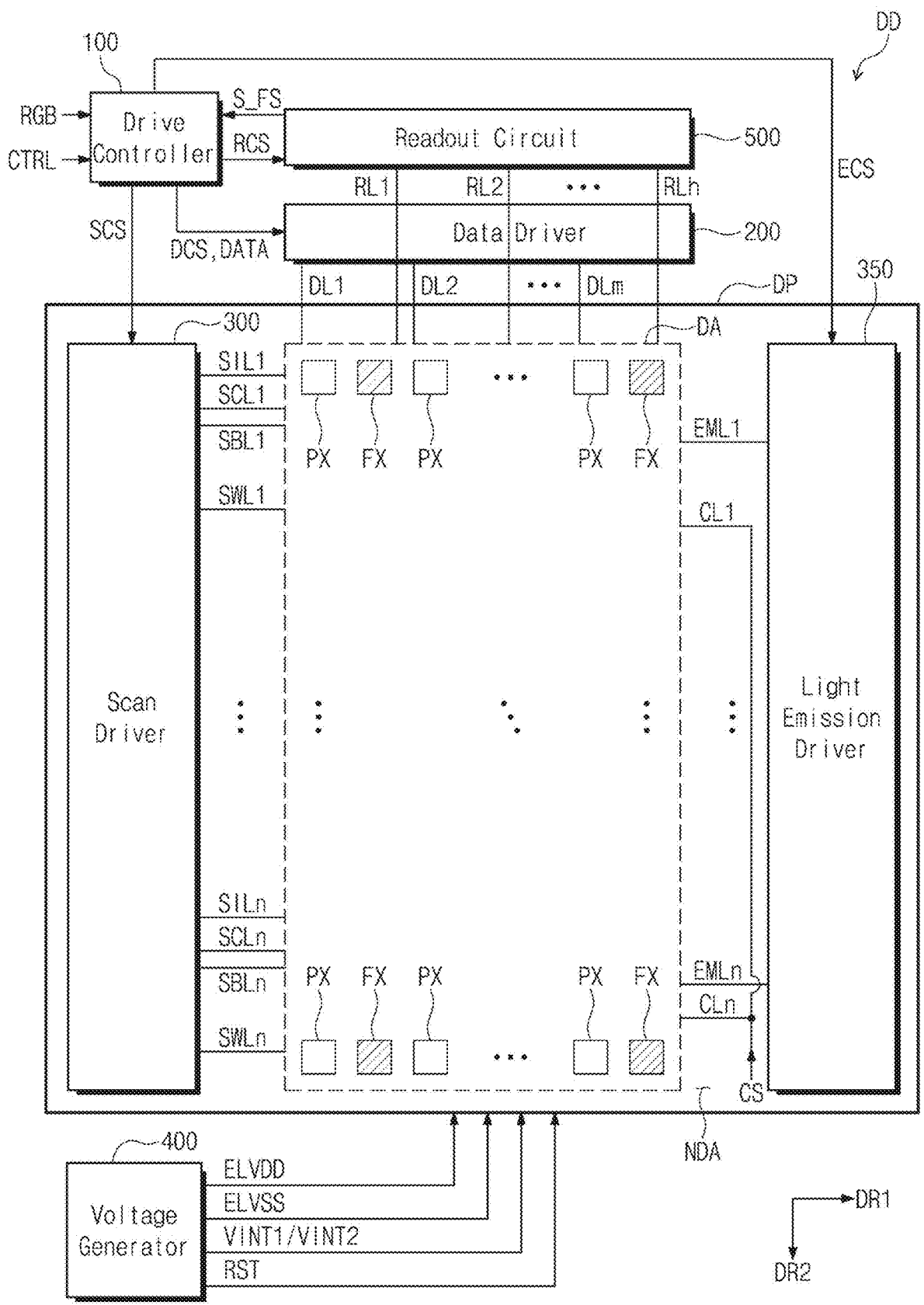
FIG. 3 is a block diagram of the display device according to some embodiments of the present disclosure.

FIG. 3 is a block diagram of the display device according to some embodiments of the present disclosure.

Referring to FIG. 3, the display device DD includes the display panel DP, a panel driver, and a drive controller 100. According to some embodiments of the present disclosure, the panel driver includes a data driver 200, a scan driver 300, a light emission driver 350, a voltage generator 400, and a readout circuit 500.

The drive controller 100 receives an image signal RGB and an external control signal CTRL. The drive controller 100 generates an image data signal DATA by converting the data format of the image signal RGB according to the specification of an interface with the data driver 200. The drive controller 100 outputs a gate drive signal SCS, a source drive signal DCS, a light emission control signal ECS, and a read control signal RCS, based on the external control signal CTRL.

The data driver 200 receives the source drive signal DCS and the image data signal DATA from the drive controller 100. The data driver 200 converts the image data signal DATA into data signals and outputs the data signals to a plurality of data lines DL1 to DLm to be described below. The data signals are analog voltages corresponding to the gray level value of the image data signal DATA.

The scan driver 300 receives the gate drive signal SCS from the drive controller 100. In response to the gate drive signal SCS, the scan driver 300 may output scan signals to a plurality of scan lines to be described below.

The voltage generator 400 generates voltages required for operation of the display panel DP. According to some embodiments, the voltage generator 400 generates a first drive voltage ELVDD, a second drive voltage ELVSS, a first initialization voltage VINT1, and a second initialization voltage VINT2. According to some embodiments of the present disclosure, the voltage generator 400 may operate under the control of the drive controller 100. According to some embodiments of the present disclosure, the first drive voltage ELVDD has a higher voltage level than the second drive voltage ELVSS. According to some embodiments of the present disclosure, the first drive voltage ELVDD may have a voltage level of about 3V to about 6V. The second drive voltage ELVSS may have a voltage level of about 0V to about −3V. The first and second initialization voltages VINT1 and VINT2 have a lower voltage level than the second drive voltage ELVSS. According to some embodiments of the present disclosure, each of the first and second initialization voltages VINT1 and VINT2 has a voltage level of about −3.1V to about −6V. However, embodiments according to the present disclosure are not limited thereto, and the voltage levels of the first drive voltage ELVDD, the second drive voltage ELVSS, and the first and second initialization voltages VINT1 and VINT2, which are generated by the voltage generator 400, may vary depending on the shapes of the display device DD and the display panel DP.

According to some embodiments of the present disclosure, the voltage generator 400 may additionally generate a reset voltage VRST. According to some embodiments of the present disclosure, the reset voltage VRST has a lower voltage level than the second drive voltage ELVSS. According to some embodiments of the present disclosure, the voltage generator 400 may generate the reset voltage VRST as the same voltage as one of the first and second initialization voltages VINT1 and VINT2.

The display panel DP may include a display area DA corresponding to the transmissive area TA (refer to FIG. 1) and a non-display area NDA corresponding to the bezel area BZA (refer to FIG. 1).

The display panel DP may include the plurality of pixels PX located in the display area DA and the plurality of sensors FX located in the display area DA. According to some embodiments of the present disclosure, each of the plurality of sensors FX may be located between two pixels PX adjacent to each other. The plurality of pixels PX and the plurality of sensors FX may be alternately arranged in the first and second directions DR1 and DR2. However, embodiments according to the present disclosure are not limited thereto. That is, two or more pixels PX may be located between two sensors FX adjacent to each other in the second direction DR2 among the plurality of sensors FX, or two or more pixels PX may be located between two sensors FX adjacent to each other in the first direction DR1 among the plurality of sensors FX.

The display panel DP further includes a plurality of initialization scan lines SIL1 to SILn, a plurality of compensation scan lines SCL1 to SCLn, a plurality of write scan lines SWL1 to SWLn, a plurality of black scan lines SBL1 to SBLn, a plurality of light emission control lines EML1 to EMLn, the plurality of data lines DL1 to DLm, a plurality of sensing lines RL1 to RLh, and a plurality of sensing control lines CL1 to CLn. The initialization scan lines SIL1 to SILn, the compensation scan lines SCL1 to SCLn, the write scan lines SWL1 to SWLn, the black scan lines SBL1 to SBLn, the light emission control lines EML1 to EMLn, and the sensing control lines CL1 to CLn extend in the first direction DR1. The initialization scan lines SIL1 to SILn, the compensation scan lines SCL1 to SCLn, the write scan lines SWL1 to SWLn, the black scan lines SBL1 to SBLn, the light emission control lines EML1 to EMLn, and the sensing control lines CL1 to CLn are arranged in the second direction DR2 so as to be spaced apart from each other. The data lines DL1 to DLm and the sensing lines RL1 to RLh extend in the second direction DR2 and are arranged in the first direction DR1 so as to be spaced apart from each other.

The plurality of pixels PX are electrically connected to the initialization scan lines SIL1 to SILn, the compensation scan lines SCL1 to SCLn, the write scan lines SWL1 to SWLn, the black scan lines SBL1 to SBLn, the light emission control lines EML1 to EMLn, and the data lines DL1 to DLm, respectively. For example, each of the plurality of pixels PX may be electrically connected to four scan lines. However, the number of scan lines connected to each pixel PX may be changed without being limited thereto.

The plurality of sensors FX are electrically connected to the sensing control lines CL1 to CLn, the write scan lines SWL1 to SWLn, and the sensing lines RL1 to RLh, respectively. However, embodiments according to the present disclosure are not limited thereto. The number of lines connected to each sensor FX may be varied. According to some embodiments of the present disclosure, the number of sensing lines RL1 to RLh may correspond to ½ of the number of data lines DL1 to DLm. However, embodiments according to the present disclosure are not limited thereto. Alternatively, the number of sensing lines RL1 to RLh may correspond to ¼ or ⅛ of the number of data lines DL1 to DLm. The number of sensing control lines CL1 to CLn may correspond to the number of write scan lines SWL1 to SWLn. However, embodiments according to the present disclosure are not limited thereto. Alternatively, the number of sensing control lines CL1 to CLn may correspond to ½, ¼, or ⅛ of the number of write scan lines SWL1 to SWLn.

The scan driver 300 may be located in the non-display area NDA of the display panel DP. The scan driver 300 receives the gate drive signal SCS from the drive controller 100. In response to the gate drive signal SCS, the scan driver 300 outputs initialization scan signals to the initialization scan lines SIL1 to SILn and outputs compensation scan signals to the compensation scan lines SCL1 to SCLn. According to some embodiments of the present disclosure, the scan driver 300 may sequentially supply the initialization scan signals to the initialization scan lines SIL1 to SILn and may sequentially supply the compensation scan signals to the compensation scan lines SCL1 to SCLn. Furthermore, in response to the gate drive signal SCS, the scan driver 300 may output write scan signals to the write scan lines SWL1 to SWLn and may output black scan signals to the black scan lines SBL1 to SBLn. According to some embodiments of the present disclosure, the scan driver 300 may sequentially supply the write scan signals to the write scan lines SWL1 to SWLn and may sequentially supply the black scan signals to the black scan lines SBL1 to SBLn.

Alternatively, the scan driver 300 may include first and second scan drivers. The first scan driver may output the initialization scan signals and the compensation scan signals, and the second scan driver may output the write scan signals and the black scan signals.

According to some embodiments of the present disclosure, a sensing control signal CS may be simultaneously supplied to the sensing control lines CL1 to CLn. According to some embodiments, the display device DD may further include a sensing controller that generates the sensing control signal CS. Alternatively, the scan driver 300 may provide the sensing control signal CS to the sensing control lines CL1 to CLn. In this case, the sensing controller may be included in the scan driver 300.

The light emission driver 350 may be located in the non-display area NDA of the display panel DP. The light emission driver 350 receives the light emission control signal ECS from the drive controller 100. The light emission driver 350 may output light emission control signals to the light emission control lines EML1 to EMLn in response to the light emission control signal ECS. Alternatively, the scan driver 300 may be connected to the light emission control lines EML1 to EMLn. In this case, the light emission driver 350 may be omitted, and the scan driver 300 may output the light emission control signals to the light emission control lines EML1 to EMLn.

The readout circuit 500 receives the read control signal RCS from the drive controller 100. The readout circuit 500 may receive sensing signals from the sensing lines RL1 to RLh in response to the read control signal RCS. The readout circuit 500 may process the sensing signals received from the sensing lines RL1 to RLh and may provide the processed sensing signals S_FS to the drive controller 100. The drive controller 100 may recognize biometric information based on the processed sensing signals S_FS.

Figure 4:
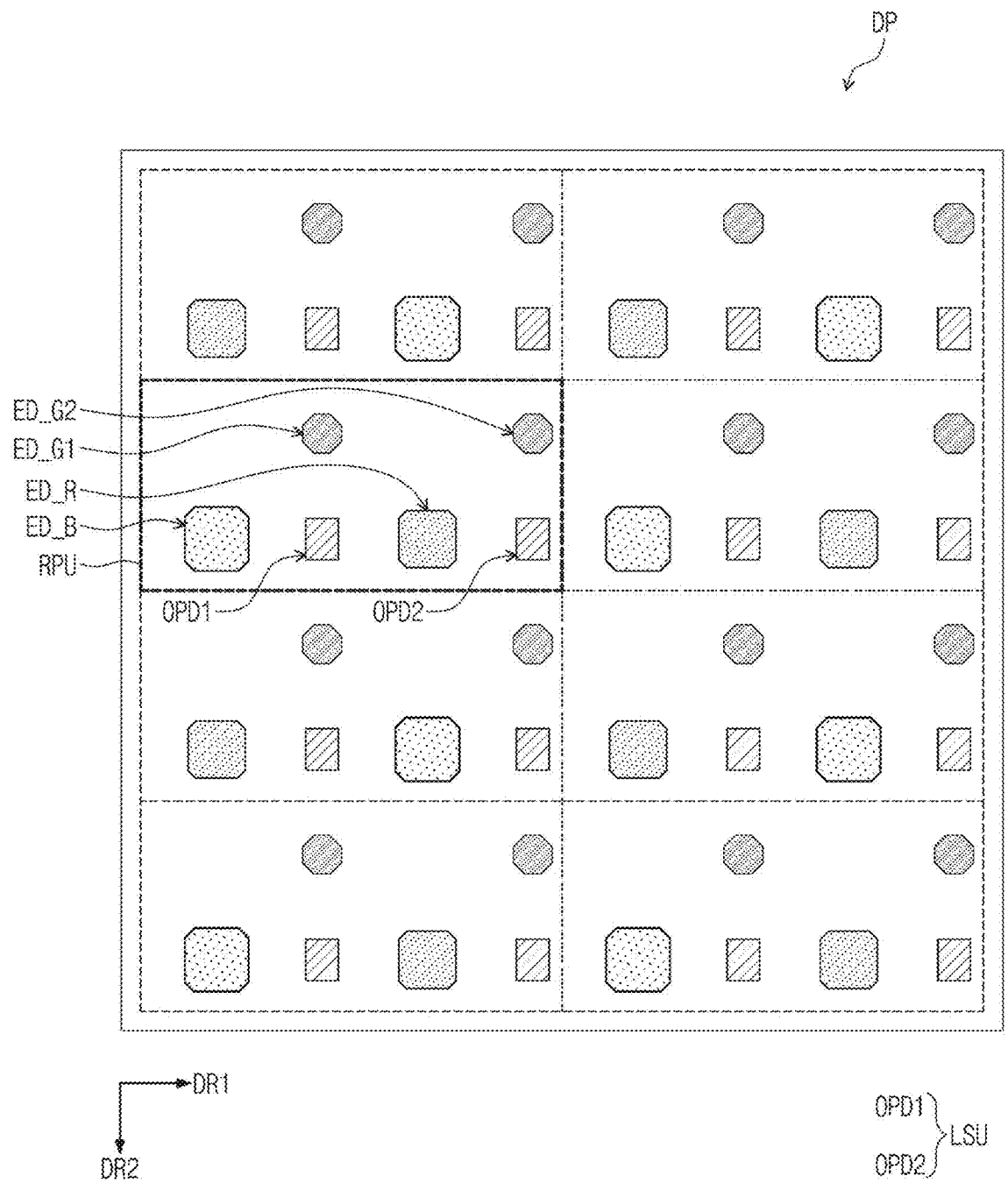
FIG. 4 is an enlarged plan view of a partial area of a display panel according to some embodiments of the present disclosure.
Figure 5A:
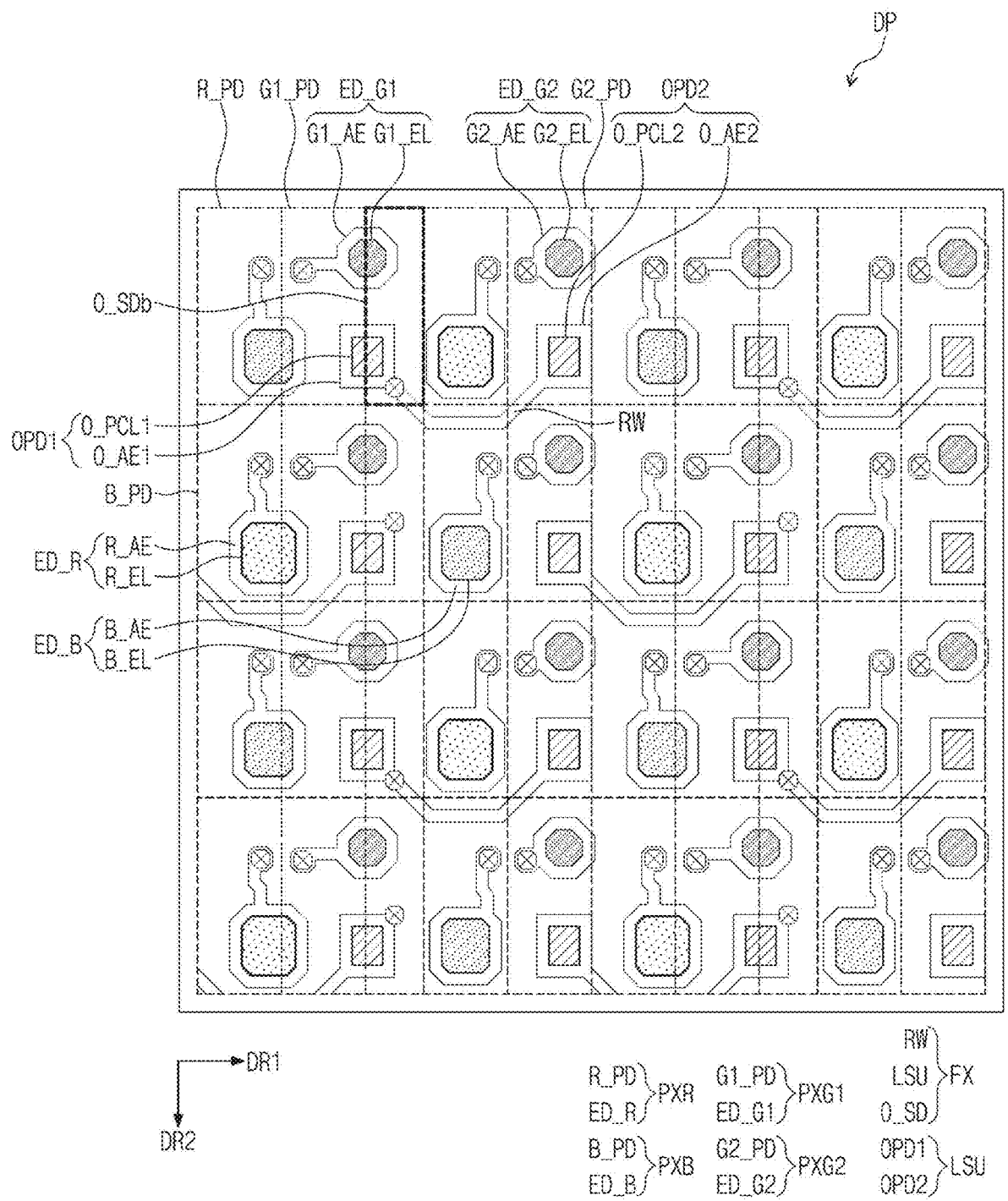
FIG. 5A is a plan view illustrating a connection relationship between a light sensing unit and a sensor drive circuit according to some embodiments of the present disclosure.
Figure 5B:
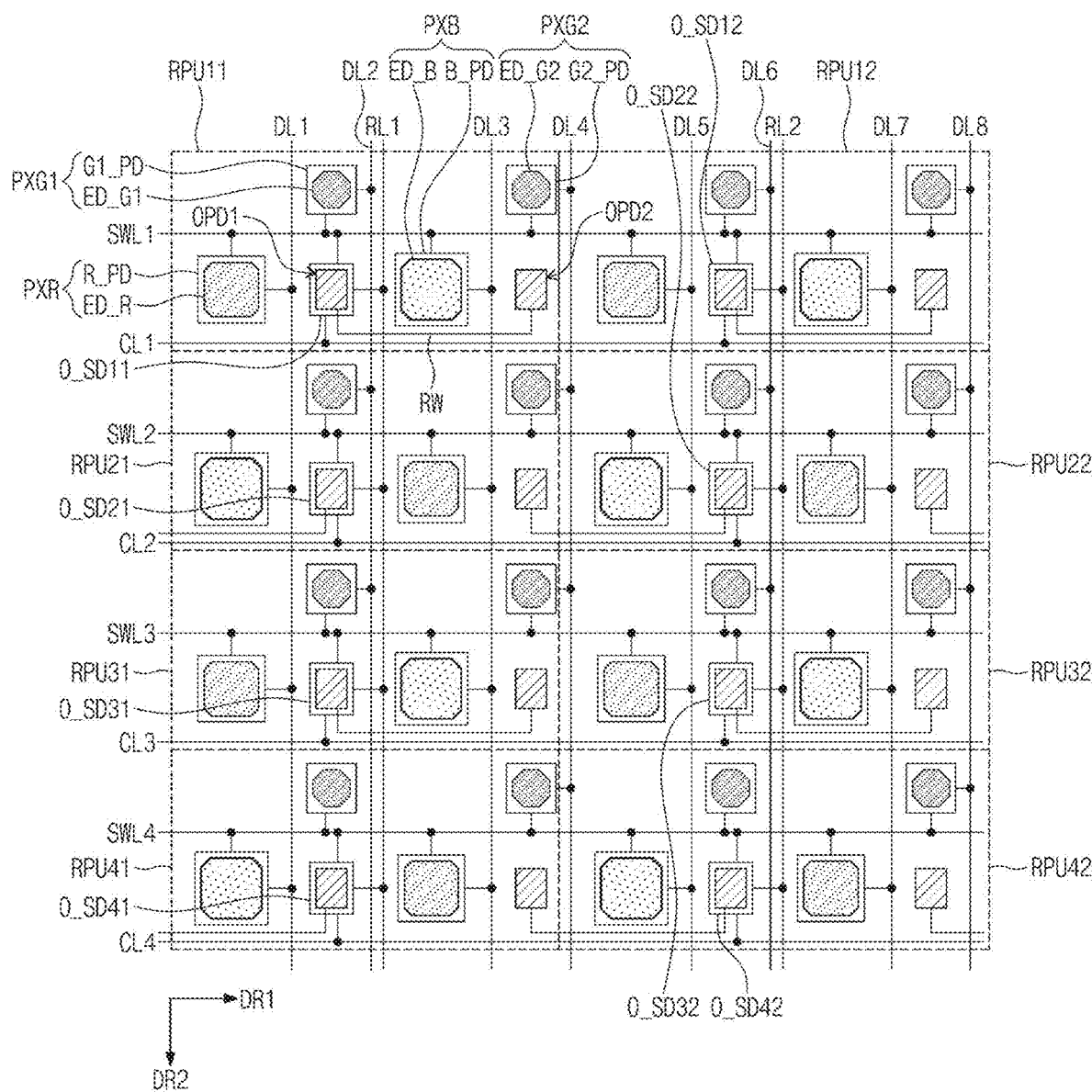
FIG. 5B is a circuit diagram illustrating the connection relationship between the light sensing unit and the sensor drive circuit illustrated in FIG. 5A.

FIG. 4 is an enlarged plan view of a partial area of the display panel according to some embodiments of the present disclosure. FIG. 5A is a plan view illustrating a connection relationship between a light sensing unit and a sensor drive circuit according to some embodiments of the present disclosure. FIG. 5B is a circuit diagram illustrating the connection relationship between the light sensing unit and the sensor drive circuit illustrated in FIG. 5A.

Referring to FIGS. 4 and 5A, the display panel DP includes the plurality of pixels PX (refer to FIG. 3) and the plurality of sensors FX (refer to FIG. 3).

The plurality of pixels PX may be grouped into a plurality of reference pixel units RPU. According to some embodiments of the present disclosure, each of the reference pixel units RPU may include four pixels, that is, a first pixel PXR (hereinafter, referred to as the red pixel), two second pixels PXG1 and PXG2 (hereinafter, referred to as the first and second green pixels), and a third pixel PXB (hereinafter, referred to as the blue pixel). However, the number of pixels included in each reference pixel unit RPU is not limited thereto. Alternatively, each reference pixel unit RPU may include three pixels, that is, a red pixel PXR, a first green pixel PXG1 (or, a second green pixel PXG2), and a blue pixel PXB.

The red pixel PXR includes a first light emitting element ED_R (hereinafter, referred to as the red light emitting element), the first and second green pixels PXG1 and PXG2 include second light emitting elements ED_G1 and ED_G2 (hereinafter, referred to as the first and second green light emitting elements), and the blue pixel PXB includes a third light emitting element ED_B (hereinafter, referred to as the blue light emitting element). According to some embodiments of the present disclosure, the red light emitting element ED_R outputs first color light (e.g., red light), the first and second green light emitting elements ED_G1 and ED_G2 output second color light (e.g., green light), and the blue light emitting element ED_B outputs third color light (e.g., blue light).

The red light emitting elements ED_R and the blue light emitting elements ED_B may be alternately and repeatedly arranged in the first and second directions DR1 and DR2. The first green light emitting elements ED_G1 may be arranged in the second direction DR2, and the second green light emitting elements ED_G2 may be arranged in the second direction DR2. The first green light emitting elements ED_G1 and the second green light emitting elements ED_G2 may be located in different columns. The first and second green light emitting elements ED_G1 and ED_G2 may be alternately arranged in the first direction DR1. The first and second green light emitting elements ED_G1 and ED_G2 may be located in different rows and columns from the red light emitting elements ED_R and the blue light emitting elements ED_B in the first and second directions DR1 and DR2.

According to some embodiments of the present disclosure, the red light emitting element ED_R may have a larger size than the first and second green light emitting elements ED_G1 and ED_G2. Furthermore, the blue light emitting element ED_B may have a size greater than or equal to the size of the red light emitting element ED_R. The sizes of the light emitting elements ED_R, ED_G1, ED_G2, and ED_B are not limited thereto and may be diversely modified. For example, according to some embodiments of the present disclosure, the light emitting elements ED_R, ED_G1, ED_G2, and ED_B may have the same size.

The first and second green light emitting elements ED_G1 and ED_G2 may have the same shape as the red and blue light emitting elements ED_R and ED_B. According to some embodiments of the present disclosure, each of the red and blue light emitting elements ED_R and ED_B may have an octagonal shape having the same length in the first direction DR1 and the second direction DR2. That is, the red and blue light emitting elements ED_R and ED_B may have the same size or different sizes, but have the same shape.

Each of the first and second green light emitting elements ED_G1 and ED_G2 may have an octagonal shape having the same length in the first direction DR1 and the second direction DR2. According to some embodiments of the present disclosure, the first and second green light emitting elements ED_G1 and ED_G2 have the same size and shape. However, the shapes of the light emitting elements ED_R, ED_G1, ED_G2, and ED_B are not limited thereto. The shapes of the light emitting elements ED_R, ED_G1, ED_G2, and ED_B may be diversely modified. According to some embodiments of the present disclosure, each of the light emitting elements ED_R, ED_G1, ED_G2, and ED_B may have a circular shape, a rectangular shape, or a diamond shape.

Each of the plurality of sensors FX includes a light sensing unit LSU. The light sensing unit LSU includes k light sensing elements. In this case, k is a natural number of 1 or larger. FIG. 4A illustrates one example that the light sensing unit LSU includes two light sensing elements (hereinafter, referred to as the first and second light sensing elements OPD1 and OPD2). However, embodiments according to the present disclosure are not limited thereto. For example, the light sensing unit LSU may include one light sensing element or three or more light sensing elements.

According to some embodiments of the present disclosure, each of the reference pixel units RPU includes the first and second light sensing elements OPD1 and OPD2. However, the number of light sensing elements included in each reference pixel unit RPU is not limited thereto. For example, one light sensing element or three or more light sensing elements may be included in each reference pixel unit RPU.

Each of the first and second light sensing elements OPD1 and OPD2 is located between the red light emitting element ED_R and the blue light emitting element ED_B in the first direction DR1. Each of the first and second light sensing elements OPD1 and OPD2 may be located adjacent to the first green light emitting element ED_G1 or the second green light emitting element ED_G2 in the second direction DR2. According to some embodiments of the present disclosure, the first light sensing element OPD1 is located between two first green light emitting elements ED_G1 adjacent to each other in the second direction DR2. The second light sensing element OPD2 is located between two second green light emitting elements ED_G2 adjacent to each other in the second direction DR2.

The first and second light sensing elements OPD1 and OPD2 may have the same size and shape. The first and second light sensing elements OPD1 and OPD2 may have a smaller size than the red and blue light emitting elements ED_R and ED_B. According to some embodiments of the present disclosure, the first and second light sensing elements OPD1 and OPD2 may have a size that is the same as, or similar to, the sizes of the first and second green light emitting elements ED_G1 and ED_G2. However, the sizes of the first and second light sensing elements OPD1 and OPD2 are not particularly limited and may be diversely modified. The first and second light sensing elements OPD1 and OPD2 may have a different shape from the red and blue light emitting elements ED_R and ED_B. According to some embodiments of the present disclosure, the first and second light sensing elements OPD1 and OPD2 may have a rectangular shape. The first and second light sensing elements OPD1 and OPD2 may have a rectangular shape that is longer in the second direction DR2 than in the first direction DR1. Alternatively, the first and second light sensing elements OPD1 and OPD2 may have a square shape having the same length in the first direction DR1 and the second direction DR2.

Referring to FIGS. 4 and 5A, each of the sensors FX includes the light sensing unit LSU and the sensor drive circuit O_SD. According to some embodiments of the present disclosure, the light sensing unit LSU includes k light sensing elements, and one of the k light sensing elements is connected to the sensor drive circuit O_SD. FIG. 5A illustrates one example that k is 2. The light sensing unit LSU includes the first light sensing element OPD1 and the second light sensing element OPD2. According to some embodiments of the present disclosure, the first and second light sensing elements OPD1 and OPD2 may be arranged in a 2×1 matrix form. One of the first and second light sensing elements OPD1 and OPD2 (e.g., the first light sensing element OPD1) is connected to the sensor drive circuit O_SD.

According to some embodiments of the present disclosure, the first and second light sensing elements OPD1 and OPD2 include first anode electrodes O_AE1 and O_AE2, photoelectric conversion layers O_PCL1 and O_PCL2 located on the first anode electrodes O_AE1 and O_AE2, and first cathode electrodes O_CA1 and O_CA2 (refer to FIG. 6) located on the photoelectric conversion layers O_PCL1 and O_PCL2, respectively. The first anode electrodes O_AE1 and O_AE2 include the first sub-anode electrode O_AE1 and the second sub-anode electrode O_AE2. The photoelectric conversion layers O_PCL1 and O_PCL2 include the first photoelectric conversion layer O_PCL1 and the second photoelectric conversion layer O_PCL2. The first cathode electrodes O_CA1 and O_CA2 include the first sub-cathode electrode O_CA1 (refer to FIG. 6) and the second sub-cathode electrode O_CA2 (refer to FIG. 6).

Specifically, the first light sensing element OPD1 includes the first sub-anode electrode O_AE1 and the first photoelectric conversion layer O_PCL1, and the second light sensing element OPD2 includes the second sub-anode electrode O_AE2 and the second photoelectric conversion layer O_PCL2. One of the first and second sub-anode electrodes O_AE1 and O_AE2 (e.g., the first sub-anode electrode O_AE1) is directly connected with the sensor drive circuit O_SD through a contact portion. The sensor drive circuit O_SD may be arranged to overlap the first light sensing element OPD1. When the light sensing element connected to the sensor drive circuit O_SD is referred to as the first light sensing element OPD1, in odd-numbered rows, the second light sensing element OPD2 may be located on the right side of the first light sensing element OPD1, and in even-numbered rows, the second light sensing element OPD2 may be located on the left side of the first light sensing element OPD1.

Each of the sensors FX may further include a routing wire RW electrically connecting the first and second light sensing elements OPD1 and OPD2. The routing wire RW electrically connects two light sensing elements (that is, the first and second light sensing elements OPD1 and OPD2) adjacent to each other in the first direction DR1. The routing wire RW is electrically connected to the first sub-anode electrode O_AE1 and the second sub-anode electrode O_AE2. According to some embodiments of the present disclosure, the routing wire RW may be integrally formed with the first and second sub-anode electrodes O_AE1 and O_AE2.

The first and second light sensing elements OPD1 and OPD2 may be connected to the sensor drive circuit O_SD in parallel by the routing wire RW. Accordingly, the first and second light sensing elements OPD1 and OPD2 may be simultaneously turned on, or may be simultaneously turned off, by the sensor drive circuit O_SD.

The sensor drive circuit O_SD may include a plurality of transistors. According to some embodiments of the present disclosure, the sensor drive circuit O_SD and pixel drive circuits R_PD, G1_PD, G2_PD, and B_PD may be simultaneously formed through the same process. Furthermore, the scan driver 300 (refer to FIG. 3) may include transistors formed through the same process as the sensor drive circuit O_SD and the pixel drive circuits R_PD, G1_PD, G2_PD, and B_PD.

The red pixel PXR includes the red light emitting element ED_R and the red pixel drive circuit R_PD, and the blue pixel PXB includes the blue light emitting element ED_B and the blue pixel drive circuit B_PD. The first green pixel PXG1 includes the first green light emitting element ED_G1 and the first green pixel drive circuit G1_PD, and the second green pixel PXG2 includes the second green light emitting element ED_G2 and the second green pixel drive circuit G2_PD. The light emitting elements ED_R, ED_G1, ED_G2, and ED_B include second anode electrodes R_AE, G1_AE, G2_AE, and B_AE, light emitting layers R_EL, G1_EL, G2_EL, and B_EL located on the second anode electrodes R_AE, G1_AE, G2_AE, and B_AE, and second cathodes located on the light emitting layers R_EL, G1_EL, G2_EL, and B_EL, respectively. The second anode electrodes R_AE, G1_AE, G2_AE, and B_AE include the red anode electrode R_AE, the first green anode electrode G1_AE, the second green anode electrode G2_AE, and the blue anode electrode B_AE. The light emitting layers R_EL, G1_EL, G2_EL, and B_EL include the red light emitting layer R_EL, the first green light emitting layer G1_EL, the second green light emitting layer G2_EL, and the blue light emitting layer B_EL. The second cathode electrodes include a red cathode electrode R_CA (refer to FIG. 6), a first green cathode electrode G1_CA (refer to FIG. 11A), a second green cathode electrode, and a blue cathode electrode B_CA (refer to FIG. 11A).

Specifically, the red light emitting element ED_R is electrically connected to the red pixel drive circuit R_PD. Specifically, the red light emitting element ED_R includes the red anode electrode R_AE and the red light emitting layer R_EL, and the red anode electrode R_AE is connected with the red pixel drive circuit R_PD through a contact portion. The first green light emitting element ED_G1 is electrically connected to the first green pixel drive circuit G1_PD. Specifically, the first green light emitting element ED_G1 includes the first green anode electrode G1_AE and the first green light emitting layer G1_EL, and the first green anode electrode G1_AE is connected with the first green pixel drive circuit G1_PD through a contact portion. The second green light emitting element ED_G2 is electrically connected to the second green pixel drive circuit G2_PD. Specifically, the second green light emitting element ED_G2 includes the second green anode electrode G2_AE and the second green light emitting layer G2_EL, and the second green anode electrode G2_AE is connected with the second green pixel drive circuit G2_PD through a contact portion. The blue light emitting element ED_B is electrically connected to the blue pixel drive circuit B_PD. Specifically, the blue light emitting element ED_B includes the blue anode electrode B_AE and the blue light emitting layer B_EL, and the blue anode electrode B_AE is connected with the blue pixel drive circuit B_PD through a contact portion.

Referring to FIGS. 5A and 5B, four scan lines (e.g., a write scan line, a compensation scan line, an initialization scan line, and a black scan line) and a sensing control line are connected to each reference pixel unit. For convenience of description, only one scan line (e.g., the write scan line) among the four scan lines and the sensing control line are illustrated in FIG. 5B. Four data lines and one sensing line may be connected to each reference pixel unit.

FIG. 5B illustrates four write scan lines SWL1 to SWL4 among the plurality of write scan lines SWL1 to SWLn (refer to FIG. 3), four sensing control lines CL1 to CL4 among the plurality of sensing control lines CL1 to CLn (refer to FIG. 3), eight data lines DL1 to DL8 among the plurality of data lines DL1 to DLm (refer to FIG. 3), and two sensing lines RL1 and RL2 among the plurality of sensing lines RL1 to RLh (refer to FIG. 3).

Reference pixel units RPU11, RPU12, RPU21, RPU22, RPU31, RPU32, RPU41, and RPU42 are arranged in a matrix form or arrangement. The first write scan line SWL1, the first sensing control line CL1, the first to fourth data lines DL1 to DL4, and the first sensing line RL1 may be connected to the first reference pixel unit RPU11 among the reference pixel units. The first write scan line SWL1, the first sensing control line CL1, the fifth to eighth data lines DL5 to DL8, and the second sensing line RL2 may be connected to the second reference pixel unit RPU12 among the reference pixel units. The second write scan line SWL2, the second sensing control line CL2, the first to fourth data lines DL1 to DL4, and the first sensing line RL1 may be connected to the third reference pixel unit RPU21 among the reference pixel units. The second write scan line SWL2, the second sensing control line CL2, the fifth to eighth data lines DL5 to DL8, and the second sensing line RL2 may be connected to the fourth reference pixel unit RPU22 among the reference pixel units. The third write scan line SWL3, the third sensing control line CL3, the first to fourth data lines DL1 to DL4, and the first sensing line RL1 may be connected to the fifth reference pixel unit RPU31 among the reference pixel units. The third write scan line SWL3, the third sensing control line CL3, the fifth to eighth data lines DL5 to DL8, and the second sensing line RL2 may be connected to the sixth reference pixel unit RPU32 among the reference pixel units. The fourth write scan line SWL4, the fourth sensing control line CL4, the first to fourth data lines DL1 to DL4, and the first sensing line RL1 may be connected to the seventh reference pixel unit RPU41 among the reference pixel units. The fourth write scan line SWL4, the fourth sensing control line CL4, the fifth to eighth data lines DL5 to DL8, and the second sensing line RL2 may be connected to the eighth reference pixel unit RPU42 among the reference pixel units.

According to some embodiments of the present disclosure, one sensing control line and one sensing line may be connected to each of sensor drive circuits. The first sensing control line CL1 and the first sensing line RL1 are connected to a first sensor drive circuit O_SD11 among the sensor drive circuits, and the first sensing control line CL1 and the second sensing line RL2 are connected to a second sensor drive circuit O_SD12. The second sensing control line CL2 and the first sensing line RL1 are connected to a third sensor drive circuit O_SD21 among the sensor drive circuits, and the second sensing control line CL2 and the second sensing line RL2 are connected to a fourth sensor drive circuit O_SD22. The third sensing control line CL3 and the first sensing line RL1 are connected to a fifth sensor drive circuit O_SD31 among the sensor drive circuits, and the third sensing control line CL3 and the second sensing line RL2 are connected to a sixth sensor drive circuit O_SD32. The fourth sensing control line CL4 and the first sensing line RL1 are connected to a seventh sensor drive circuit O_SD41 among the sensor drive circuits, and the fourth sensing control line CL4 and the second sensing line RL2 are connected to an eighth sensor drive circuit O_SD42.

The light sensing unit LSU includes the first and second light sensing elements OPD1 and OPD2. The sensor drive circuits O_SD11, O_SD12, O_SD21, O_SD22, O_SD31, O_SD32, O_SD41, and O_SD42 are connected to one of the first and second light sensing elements OPD1 and OPD2 (e.g., the first light sensing element OPD1).

The sensor drive circuits O_SD11 to O_SD42 are electrically connected to the corresponding sensing control lines CL1 to CL4. Accordingly, the sensor drive circuits O_SD11 to O_SD42 receive the sensing control signal CS (refer to FIG. 3) through the corresponding sensing control lines CL1 to CL4.

Figure 6:
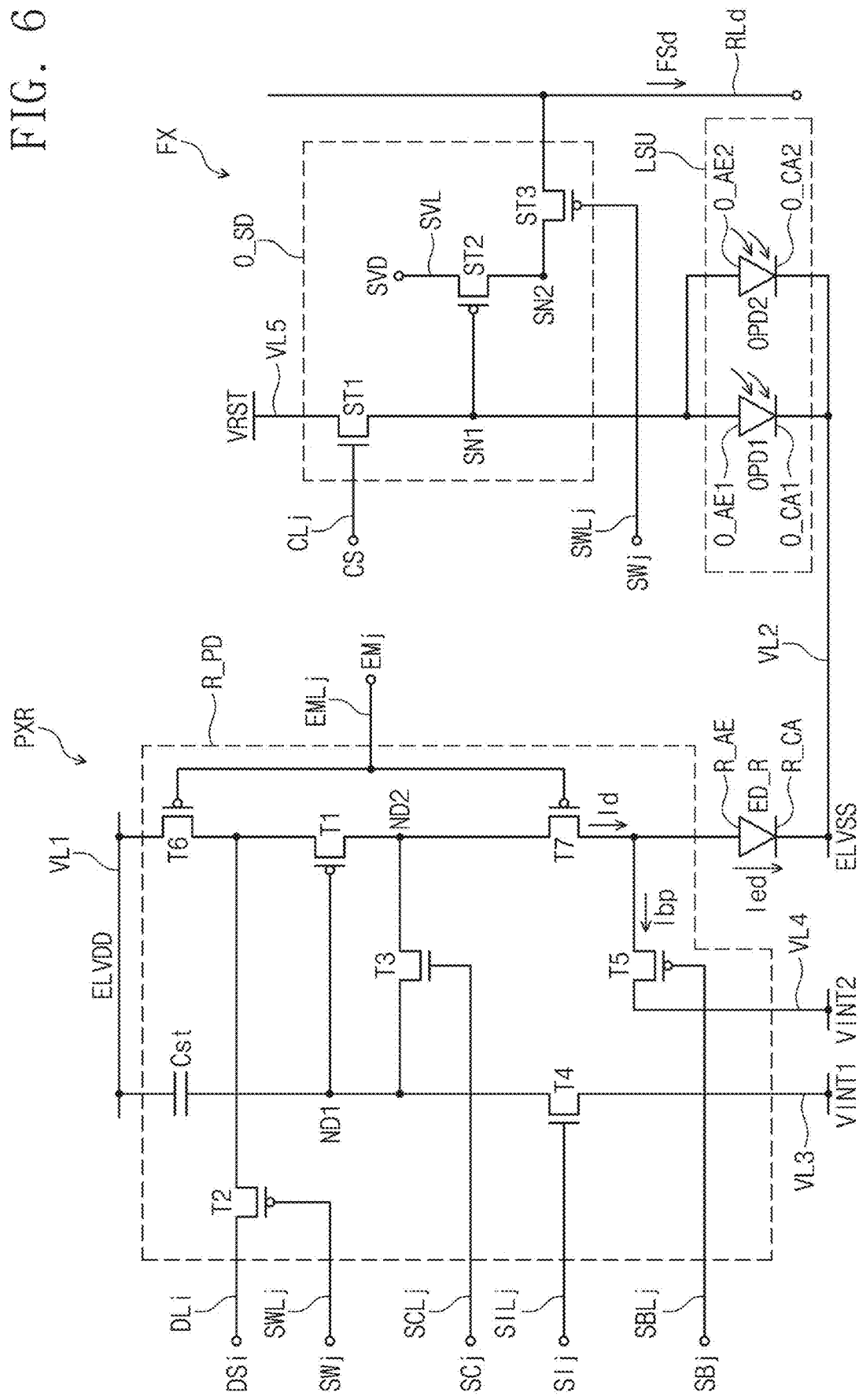
FIG. 6 is a circuit diagram illustrating a pixel and a sensor according to some embodiments of the present disclosure.
Figure 7:
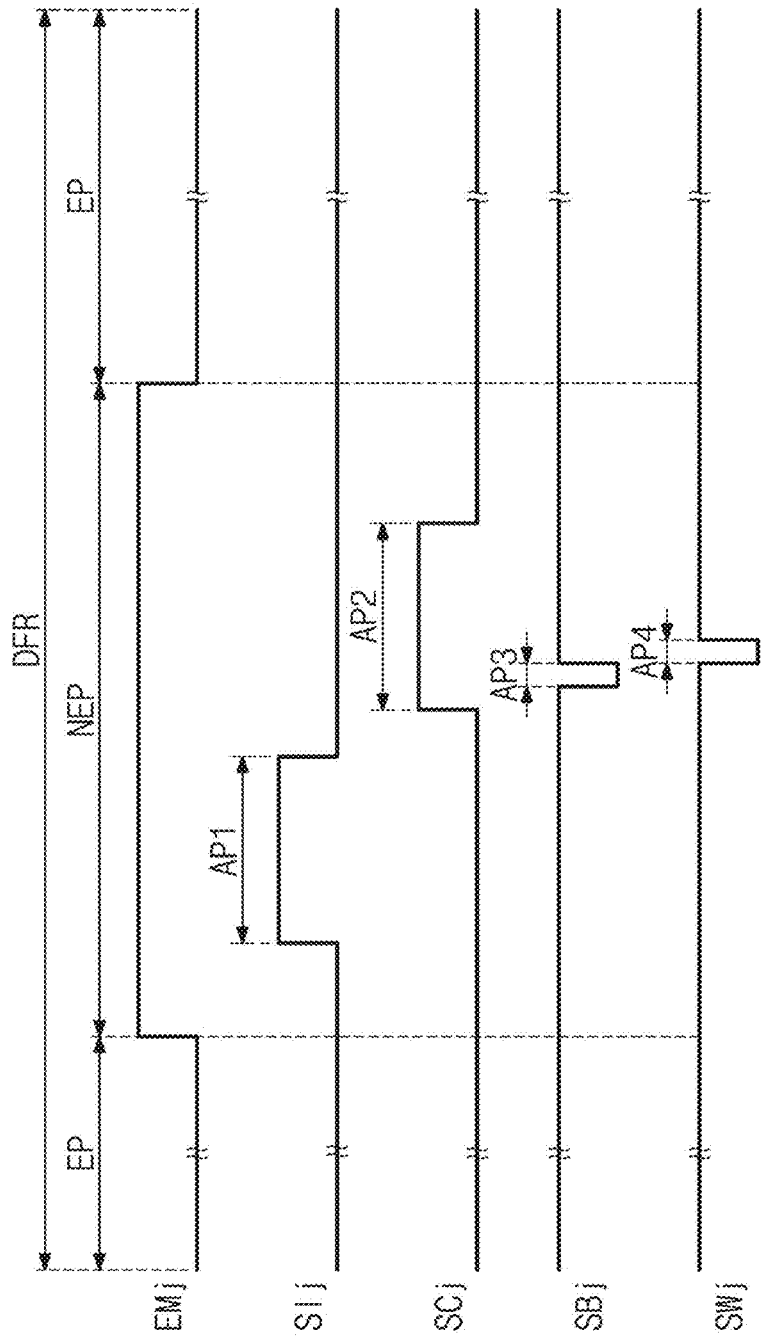
FIG. 7 is a waveform diagram for describing operations of the pixel and the sensor illustrated in FIG. 6.
Figure 8:
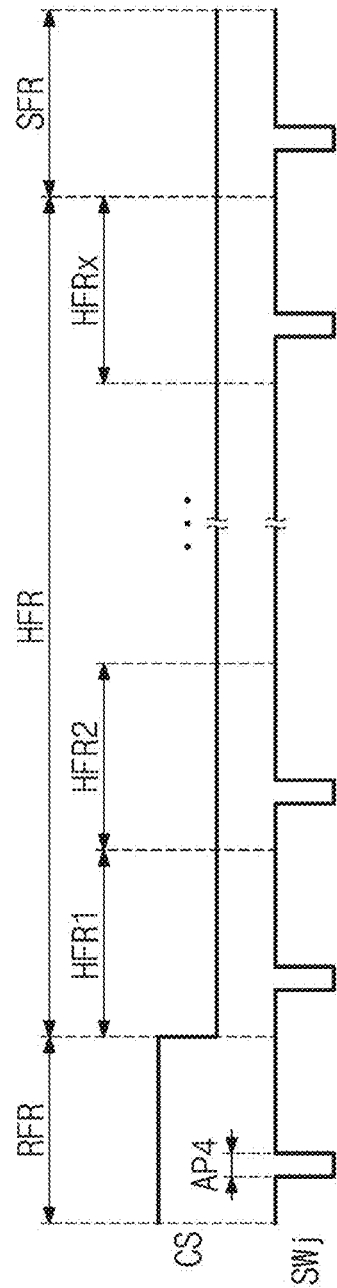
FIG. 8 is a waveform diagram illustrating sensing timing of the sensor illustrated in FIG. 6.

FIG. 6 is a circuit diagram illustrating a pixel and a sensor according to some embodiments of the present disclosure. FIG. 7 is a waveform diagram for describing operations of the pixel and the sensor illustrated in FIG. 6. FIG. 8 is a waveform diagram illustrating sensing timing of the sensor illustrated in FIG. 6.

FIG. 6 illustrates an equivalent circuit diagram of one pixel (e.g., the red pixel PXR) among the plurality of pixels PX illustrated in FIG. 3. The plurality of pixels PX have the same circuit structure. Therefore, description of the circuit structure of the red pixel PXR may be applied to the remaining pixels, and detailed descriptions of the remaining pixels will be omitted. Furthermore, FIG. 6 illustrates an equivalent circuit diagram of one sensor FX among the plurality of sensors FX illustrated in FIG. 3. The plurality of sensors FX have the same circuit structure. Therefore, description of the circuit structure of the sensor FX may be applied to the remaining sensors, and detailed descriptions of the remaining sensors will be omitted.

Referring to FIG. 6, the red pixel PXR is connected to the i-th data line DLi among the data lines DL1 to DLm, the j-th initialization scan line SILj among the initialization scan lines SIL1 to SILn, the j-th compensation scan line SCLj among the compensation scan lines SCL1 to SCLn, the j-th write scan line SWLj among the write scan lines SWL1 to SWLn, the j-th black scan line SBLj among the black scan lines SBL1 to SBLn, and the j-th light emission control line EMLj among the light emission control lines EML1 to EMLn.

The red pixel PXR includes the red light emitting element ED_R and the red pixel drive circuit R_PD. The red light emitting element ED_R may be a light emitting diode. According to some embodiments of the present disclosure, the red light emitting element ED_R may be an organic light emitting diode including an organic light emitting layer.

The red pixel drive circuit R_PD includes first to seventh transistors T1, T2, T3, T4, T5, T6, and T7 and one capacitor Cst. At least one of the first to seventh transistors T1, T2, T3, T4, T5, T6, or T7 may be a transistor having a low-temperature polycrystalline silicon (LTPS) semiconductor layer. At least one of the first to seventh transistors T1, T2, T3, T4, T5, T6, or T7 may be a transistor having an oxide semiconductor layer. Some of the first to seventh transistors T1, T2, T3, T4, T5, T6, and T7 may be P-type transistors, and the others may be N-type transistors. For example, the first, second, fifth, sixth, and seventh transistors T1, T2, T5, T6, and T7 may be PMOS transistors, and the third and fourth transistors T3 and T4 may be NMOS transistors. For example, the third and fourth transistors T3 and T4 may be oxide semiconductor transistors, and the first, second, fifth, sixth, and seventh transistors T1, T2, T5, T6, and T7 may be LTPS transistors.

The configuration of the red pixel drive circuit R_PD according to the present disclosure is not limited to the embodiments illustrated with respect to FIG. 6. The red pixel drive circuit R_PD illustrated in FIG. 6 is merely an example, and various changes and modifications can be made to the configuration of the red pixel drive circuit R_PD. For example, the first to seventh transistors T1, T2, T3, T4, T5, T6, and T7 may all be P-type transistors or N-type transistors.

The j-th initialization scan line SILj, the j-th compensation scan line SCLj, the j-th write scan line SWLj, the j-th black scan line SBLj, and the j-th light emission control line EMLj may transfer the j-th initialization scan signal SIj, the j-th compensation scan signal SCj, the j-th write scan signal SWj, the j-th black scan signal SBj, and the j-th light emission control signal EMj to the red pixel PXR, respectively. The i-th data line DLi transfers the i-th data signal Di to the red pixel PXR. The i-th data signal Di may have a voltage level corresponding to the image signal RGB (refer to FIG. 3) that is input to the display device DD (refer to FIG. 3).

A first drive voltage line VL1 and a second drive voltage line VL2 may transfer the first drive voltage ELVDD and the second drive voltage ELVSS to the red pixel PXR, respectively. Furthermore, a first initialization voltage line VL3 and a second initialization voltage line VL4 may transfer the first initialization voltage VINT1 and the second initialization voltage VINT2 to the red pixel PXR, respectively.

The first transistor T1 is connected between the first drive voltage line VL1 receiving the first drive voltage ELVDD and the red light emitting element ED_R. The first transistor T1 includes a first electrode connected with the first drive voltage line VL1 via the sixth transistor T6, a second electrode connected with the red anode electrode R_AE of the red light emitting element ED_R via the seventh transistor T7, and a third electrode connected with one end of the capacitor Cst (e.g., a first node ND1). The first transistor T1 may receive the i-th data signal Di that the i-th data line DLi transfers depending on a switching operation of the second transistor T2 and may supply a drive current Id to the red light emitting element ED_R. According to some embodiments of the present disclosure, the first transistor T1 may be referred to as a drive transistor.

The second transistor T2 is connected between the i-th data line DLi and the first electrode of the first transistor T1. The second transistor T2 includes a first electrode connected with the i-th data line DLi, a second electrode connected with the first electrode of the first transistor T1, and a third electrode connected with the j-th write scan line SWLj. The second transistor T2 may be turned on in response to the j-th write scan signal SWj transferred through the j-th write scan line SWLj and may transfer, to the first electrode of the first transistor T1, the i-th data signal Di transferred from the i-th data line DLi. According to some embodiments of the present disclosure, the second transistor T2 may be referred to as a switching transistor.

The third transistor T3 is connected between the second electrode of the first transistor T1 and the first node ND1. The third transistor T3 includes a first electrode connected with the third electrode of the first transistor T1, a second electrode connected with the second electrode of the first transistor T1, and a third electrode connected with the j-th compensation scan line SCLj. The third transistor T3 may be turned on in response to the j-th compensation scan signal SCj transferred through the j-th compensation scan line SCLj and may diode-connect the first transistor T1 by connecting the third electrode and the second electrode of the first transistor T1. According to some embodiments of the present disclosure, the third transistor T3 may be referred to as a compensation transistor.

The fourth transistor T4 is connected between the first initialization voltage line VL3 through which the first initialization voltage VINT1 is applied and the first node ND1. The fourth transistor T4 includes a first electrode connected with the first initialization voltage line VL3, a second electrode connected with the first node ND1, and a third electrode connected with the j-th initialization scan line SILj. The fourth transistor T4 is turned on in response to the j-th initialization scan signal SIj transferred through the j-th initialization scan line SILj. The turned-on fourth transistor T4 initializes the potential of the third electrode of the first transistor T1 (that is, the potential of the first node ND1) by transferring the first initialization voltage VINT1 to the first node ND1. According to some embodiments of the present disclosure, the fourth transistor T4 may be referred to as an initialization transistor.

The sixth transistor T6 includes a first electrode connected with the first drive voltage line VL1, a second electrode connected with the first electrode of the first transistor T1, and a third electrode connected to the j-th light emission control line EMLj.

The seventh transistor T7 includes a first electrode connected with the second electrode of the first transistor T1, a second electrode connected to the red anode electrode R_AE of the red light emitting element ED_R, and a third electrode connected to the j-th light emission control line EMLj.

The sixth and seventh transistors T6 and T7 are simultaneously turned on in response to the j-th light emission control signal EMj transferred through the j-th light emission control line EMLj. The first drive voltage ELVDD applied through the turned-on sixth transistor T6 may be compensated for through the diode-connected first transistor T1 and may be transferred to the red light emitting element ED_R. According to some embodiments of the present disclosure, the sixth and seventh transistors T6 and T7 may be referred to as light emission transistors.

The fifth transistor T5 includes a first electrode connected to the second initialization voltage line VL4 through which the second initialization voltage VINT2 is applied, a second electrode connected with the second electrode of the seventh transistor T7, and a third electrode connected with the j-th black scan line SBLj. The second initialization voltage VINT2 may have a voltage level lower than or equal to the voltage level of the first initialization voltage VINT1. According to some embodiments of the present disclosure, the fifth transistor T5 may be referred to as a black scan transistor.

The one end of the capacitor Cst is connected with the third electrode of the first transistor T1 as described above, and an opposite end of the capacitor Cst is connected with the first drive voltage line VL1.

The red cathode electrode R_CA of the red light emitting element ED_R may be connected with the second drive voltage line VL2 that transfers the second drive voltage ELVSS. The second drive voltage ELVSS may have a lower voltage level than the first drive voltage ELVDD. According to some embodiments of the present disclosure, the second drive voltage ELVSS may have a lower voltage level than the first and second initialization voltages VINT1 and VINT2.

Referring to FIGS. 6 and 7, within one drive frame DFR of the display panel DP (refer to FIG. 3), the j-th light emission control signal EMj includes a light emission period EP and a non-light emission period NEP. The j-th light emission control signal EMj has a high level during the non-light emission period NEP. Within the non-light emission period NEP, the j-th initialization scan signal SIj is activated. When the j-th initialization scan signal SIj having a high level is provided through the j-th initialization scan line SILj during an activation period AP1 of the j-th initialization scan signal SIj (hereinafter, referred to as the first activation period), the fourth transistor T4 is turned on in response to the j-th initialization scan signal SIj having the high level. The first initialization voltage VINT1 is transferred to the third electrode of the first transistor T1 through the turned-on fourth transistor T4, and the first node ND1 is initialized to the first initialization voltage VINT1. Accordingly, the first activation period AP1 may be defined as an initialization period of the red pixel PXR.

Next, the j-th compensation scan signal SCj is activated, and when the j-th compensation scan signal SCj having a high level is supplied through the j-th compensation scan line SCLj during an activation period AP2 of the j-th compensation scan signal SCj (hereinafter, referred to as the second activation period), the third transistor T3 is turned on. The first transistor T1 is diode-connected by the turned-on third transistor T3 and is forward-biased. The first activation period AP1 may not overlap the second activation period AP2.

Within the second activation period AP2, the j-th write scan signal SWj is activated. The j-th write scan signal SWj has a low level during an activation period AP4 (hereinafter, referred to as the fourth activation period). During the fourth activation period AP4, the second transistor T2 is turned on by the j-th write scan signal SWj having the low level. Then, a compensation voltage "Di−Vth" obtained by subtracting the threshold voltage Vth of the first transistor T1 from the i-th data signal Di supplied from the i-th data line DLi is applied to the third electrode of the first transistor T1. That is, the potential of the third electrode of the first transistor T1 may be the compensation voltage "Di−Vth". The fourth activation period AP4 may overlap the second activation period AP2. The duration of the second activation period AP2 may be greater than the duration of the fourth activation period AP4.

The first drive voltage ELVDD and the compensation voltage "Di−Vth" may be applied to the opposite ends of the capacitor Cst, and charges corresponding to the difference between the voltages at the opposite ends of the capacitor Cst may be stored in the capacitor Cst. Here, the period during which the j-th compensation scan signal SCj has the high level may be referred to as a compensation period of the red pixel PXR.

Meanwhile, the j-th black scan signal SBj is activated within the second activation period AP2 of the j-th compensation scan signal SCj. The j-th black scan signal SBj has a low level during an activation period AP3 (hereinafter, referred to as the third activation period). During the third activation period AP3, the fifth transistor T5 is turned on by receiving the j-th black scan signal SBj having the low level through the j-th black scan line SBLj. A portion of the drive current Id may escape through the fifth transistor T5 as a bypass current Ibp. The third activation period AP3 may overlap the second activation period AP2. The duration of the second activation period AP2 may be greater than the duration of the third activation period AP3. The third activation period AP3 may precede the fourth activation period AP4 and may not overlap the fourth activation period AP4.

When the red pixel PXR displays a black image, the red pixel PXR cannot normally display the black image if the red light emitting element ED_R emits light even though the minimum drive current of the first transistor T1 flows as the drive current Id. Accordingly, the fifth transistor T5 according to some embodiments of the present disclosure may distribute a portion of the minimum drive current of the first transistor T1 as the bypass current Ibp to a different current path other than the current path toward the red light emitting element ED_R. Here, the minimum drive current of the first transistor T1 refers to the leakage current flowing to the first transistor T1 under the condition that the gate-source voltage Vgs of the first transistor T1 is lower than the threshold voltage Vth so that the first transistor T1 is turned off. The minimum drive current (e.g., a current of 10 pA or less) flowing to the first transistor T1 under the condition that the first transistor T1 is turned off is transferred to the red light emitting element ED_R, and a black gray-scale image is displayed. When the red pixel PXR displays a black image, an influence of the bypass current Ibp on the minimum drive current is relatively great, whereas when the red pixel PXR displays an image such as a normal image or a white image, the bypass current Ibp has little influence on the drive current Id. Accordingly, when the red pixel PXR displays a black image, a current obtained by subtracting the bypass current Ibp escaping through the fifth transistor T5 from the drive current Id (that is, a light emission current Ied) may be provided to the red light emitting element ED_R so that the black image may be clearly expressed. Thus, the red pixel PXR may implement an accurate black gray-scale image using the fifth transistor T5. As a result, the contrast ratio may be improved.

After that, the j-th light emission control signal EMj supplied from the j-th light emission control line EMLj is changed from the high level to a low level. The sixth and seventh transistors T6 and T7 are turned on by the light emission control signal EMj having the low level. Then, the drive current Id depending on the difference between the voltage of the third electrode of the first transistor T1 and the first drive voltage ELVDD is generated. The drive current Id is supplied to the red light emitting element ED_R through the seventh transistor T7, and the current Ied flows through the red light emitting element ED_R.

Referring again to FIG. 6, the sensor FX is connected to the d-th sensing line RLd among the sensing lines RL1 to RLh, the j-th write scan line SWLj, and the j-th sensing control line CLj.

The sensor FX includes the light sensing unit LSU and the sensor drive circuit O_SD. The light sensing unit LSU may include k light sensing elements connected in parallel. When k is 2, two light sensing elements (that is, the first and second light sensing elements OPD1 and OPD2) may be connected to the sensor drive circuit O_SD in parallel. Each of the first and second light sensing elements OPD1 and OPD2 may be a photo diode. According to some embodiments of the present disclosure, each of the first and second light sensing elements OPD1 and OPD2 may be an organic photo diode containing an organic material as a photoelectric conversion layer. The first and second sub-anode electrodes O_AE1 and O_AE2 of the first and second light sensing elements OPD1 and OPD2 may be connected to a first sensing node SN1, and the first and second sub-cathode electrodes O_CA1 and O_CA2 of the first and second light sensing elements OPD1 and OPD2 may be connected with the second drive voltage line VL2 that transfers the second drive voltage ELVSS.

The sensor drive circuit O_SD includes three transistors ST1, ST2, and ST3. The three transistors ST1, ST2, and ST3 may include the reset transistor ST1, the amplifying transistor ST2, and the output transistor ST3. At least one of the reset transistor ST1, the amplifying transistor ST2, or the output transistor ST3 may be an oxide semiconductor transistor. According to some embodiments of the present disclosure, the reset transistor ST1 may be an oxide semiconductor transistor, and the amplifying transistor ST2 and the output transistor ST3 may be LTPS transistors. However, without being limited thereto, at least the reset transistor ST1 and the output transistor ST3 may be oxide semiconductor transistors, and the amplifying transistor ST2 may be an LTPS transistor.

Furthermore, some of the reset transistor ST1, the amplifying transistor ST2, and the output transistor ST3 may be P-type transistors, and the rest may be an N-type transistor. According to some embodiments of the present disclosure, the amplifying transistor ST2 and the output transistor ST3 may be PMOS transistors, and the reset transistor ST1 may be an NMOS transistor. However, without being limited thereto, the reset transistor ST1, the amplifying transistor ST2, and the output transistor ST3 may all be N-type transistors or P-type transistors.

Some of the reset transistor ST1, the amplifying transistor ST2, and the output transistor ST3 (e.g., the reset transistor ST1) may be of the same type as the third and fourth transistors T3 and T4 of the red pixel PXR. The amplifying transistor ST2 and the output transistor ST3 may be transistors of the same type as the first, second, fifth, sixth, and seventh transistors T1, T2, T5, T6, and T7 of the red pixel PXR.

A circuit configuration of the sensor drive circuit O_SD according to the present disclosure is not limited to that illustrated in FIG. 6. The sensor drive circuit O_SD illustrated in FIG. 6 is merely illustrative, and various changes and modifications can be made to the configuration of the sensor drive circuit O_SD.

The reset transistor ST1 includes a first electrode connected with a reset receiving line VL5 that receives the reset voltage VRST, a second electrode connected with the first sensing node SN1, and a third electrode connected with the j-th sensing control line CLj that receives the sensing control signal CS. The reset transistor ST1 may reset the potential of the first sensing node SN1 to the reset voltage VRST in response to the sensing control signal CS.

According to some embodiments of the present disclosure, the reset voltage VRST may be a DC voltage maintained at a lower voltage level than the second drive voltage ELVSS. However, embodiments according to the present disclosure are not limited thereto. The reset voltage VRST may have a lower voltage level than the second drive voltage ELVSS at least during an activation period of the sensing control signal CS.

The reset transistor ST1 may include a plurality of sub-reset transistors connected in series. For example, the reset transistor ST1 may include two sub-reset transistors (hereinafter, referred to as the first and second sub-reset transistors). In this case, a third electrode of the first sub-reset transistor and a third electrode of the second sub-reset transistor are connected to the j-th sensing control line CLj. Furthermore, a second electrode of the first sub-reset transistor and a first electrode of the second sub-reset transistor may be electrically connected with each other. In addition, the reset voltage VRST may be applied to a first electrode of the first sub-reset transistor, and a second electrode of the second sub-reset transistor may be electrically connected with the first sensing node SN1. However, the number of sub-reset transistors is not limited thereto and may be diversely modified.

The amplifying transistor ST2 includes a first electrode connected with a sensing drive line SVL that receives a sensing drive voltage SVD, a second electrode connected with a second sensing node SN2, and a third electrode connected with the first sensing node SN1. The amplifying transistor ST2 may be turned on depending on the potential of the first sensing node SN1 and may apply the sensing drive voltage SVD to the second sensing node SN2. According to some embodiments of the present disclosure, the sensing drive voltage SVD may be one of the first drive voltage ELVDD and the first and second initialization voltages VINT1 and VINT2. When the sensing drive voltage SVD is the first drive voltage ELVDD, the sensing drive line SVL may be electrically connected to the first drive voltage line VL1. When the sensing drive voltage SVD is the first initialization voltage VINT1, the sensing drive line SVL may be electrically connected to the first initialization voltage line VL3, and when the sensing drive voltage SVD is the second initialization voltage VINT2, the sensing drive line SVL may be electrically connected to the second initialization voltage line VL4.

The output transistor ST3 includes a first electrode connected with the second sensing node SN2, a second electrode connected with the d-th sensing line RLd, and a third electrode connected with an output control line that receives an output control signal. The output transistor ST3 may transfer the d-th sensing signal FSd to the d-th sensing line RLd in response to the output control signal. The output control signal may be the j-th write scan signal SWj supplied through the j-th write scan line SWLj. That is, the output transistor ST3 may receive the j-th write scan signal SWj, which is supplied from the j-th write scan line SWLj, as the output control signal.

The light sensing unit LSU of the sensor FX may be exposed to light during light emission periods of the light emitting elements ED_R, ED_G1, ED_G2, and ED_B (refer to FIG. 4). The light may be light output from one of the light emitting elements ED_R, ED_G1, ED_G2, and ED_B. In the following description of FIGS. 6 and 8, the light sensing unit LSU will be described as being exposed by light output from the red light emitting element ED_R.

If the user's hand US_F (refer to FIG. 1) touches the display surface IS (refer to FIG. 1) of the display device DD (refer to FIG. 1), the first and second light sensing elements OPD1 and OPD2 may generate photo-charges corresponding to light reflected by ridges of a fingerprint of the user's hand US_F or valleys between the ridges, and the generated photo-charges may be accumulated in the first sensing node SN1.

The d-th sensing signal FSd flowing from the sensing drive line SVL to the d-th sensing line RLd through the amplifying transistor ST2 and the output transistor ST3 when the output transistor ST3 is turned on is determined by the amount of charges in the first sensing node SN1. According to some embodiments of the present disclosure, when the output transistor ST3 is a P-type transistor, the magnitude of the d-th sensing signal FSd may be decreased as the amount of photo-charges generated by the first and second light sensing elements OPD1 and OPD2 and accumulated in the first sensing node SN1 is increased.

Referring to FIGS. 6 and 8, a drive frame of the sensor FX includes a reset frame RFR, a hold frame HFR, and a sensing frame SFR. According to some embodiments of the present disclosure, the hold frame HFR includes a plurality of sub-hold frames HFR1 to HFRx. The duration of each of the reset frame RFR, the sub-hold frames HFR1 to HFRx, and the sensing frame SFR may be equal to the duration of the drive frame DFR of the display panel DP illustrated in FIG. 7.

In the reset frame RFR, the sensing control signal CS is activated. The sensing control signal CS has a high level during the rest frame RFR. During the reset frame RFR, the reset transistor ST1 is turned on by the sensing control signal CS having the high level. When the reset transistor ST1 is turned on, the first sensing node SN1 is reset to the rest voltage VRST. In the reset frame RFR, the j-th write scan signal SWj has a low level during the fourth activation period AP4. During the fourth activation period AP4, the output transistor ST3 is turned on by the j-th write scan signal SWj having the low level. Then, the d-th sensing signal FSd corresponding to the current flowing through the amplifying transistor ST2 may be output to the d-th sensing line RLd. Although FIG. 8 illustrates one example that the sensing control signal CS is activated during the reset frame RFR, embodiments according to the present disclosure are not limited thereto. According to some embodiments of the present disclosure, the sensing control signal CS may be activated during a partial period in the reset frame RFR and may be deactivated during the remaining period.

During the hold frame HFR, the sensing control signal CS is deactivated. The sensing control signal CS has a low level during the deactivation period. During the hold frame HFR, the reset transistor ST1 is turned off, and the first sensing node SN1 is not reset to the reset voltage VRST. Referring to FIGS. 7 and 8, the j-th light emission control signal EMj includes the light emission period EP in each of the sub-hold frames HFR1 to HFRx. During the sub-hold frames HFR1 to HFRx, the first sensing node SN1 is not reset to the reset voltage VRST, and during the plurality of light emission periods EP, photo-charges generated by the first and second light sensing elements OPD1 and OPD2 exposed to light output from the red light emitting element ED_R are accumulated. In each of the sub-holed frames HFR1 to HFRx, the j-th write scan signal SWj has the fourth activation period AP4. During the fourth activation period AP4 included in each sub-hold frame, the output transistor ST3 is turned on by the j-th write scan signal SWj having the low level. Then, the d-th sensing signal FSd corresponding to the current flowing through the amplifying transistor ST2 may be output to the d-th sensing line RLd.

During the sensing frame SFR, the sensing control signal CS is deactivated. During the sensing frame SFR, the reset transistor ST1 is turned off, and the first sensing node SN1 is not reset to the reset voltage VRST. In the sensing frames SFR, the j-th write scan signal SWj has the fourth activation period AP4. During the fourth activation period AP4 included in the sensing frame SFR, the output transistor ST3 is turned on by the j-th write scan signal SWj having the low level. Then, the d-th sensing signal FSd corresponding to the current flowing through the amplifying transistor ST2 may be output to the d-th sensing line RLd.

According to some embodiments of the present disclosure, the readout circuit 500 (refer to FIG. 3) receives the d-th sensing signal FSd from the d-th sensing line RLd during the reset frame RFR, the hold frame HFR, and the sensing frame SFR. The readout circuit 500 may process the d-th sensing signal FSd received during the sensing frame SFR and may provide the processed sensing signal S_FS to the drive controller 100 (refer to FIG. 3). The drive controller 100 may recognize biometric information of the user based on the processed sensing signal S_FS.

According to some embodiments of the present disclosure, the sensor FX may prepare to recognize biometric information of the user by the user's hand US_F (refer to FIG. 1) by resetting the first sensing node SN1 to the reset voltage VRST during the reset frame RFR. As a signal independent of a scan signal (e.g., the j-th compensation scan signal SCj) provided to the pixel PX is used as the sensing control signal CS, the sensor FX may reset the first sensing node SN1 to the reset voltage VRST only in the reset frame RFR and may not reset the first sensing node SN1 to the reset voltage VRST in the hold frame HFR. The sensor FX accumulates the photo-charges generated by the first and second light sensing elements OPD1 and OPD2 without resetting the first sensing node SN1 to the reset voltage VRST during the hold frame HFR. The sensor FX generates the activated processed sensing signal S_FS by processing the d-th sensing signal FSd received through the readout circuit 500 during the sensing frame SFR following the hold frame HFR. The sensor FX accumulates the photo-charges in the first sensing node SN1 during the hold frame HFR and calculates biometric information of the user based on the accumulated photo-charges in the sensing frame SFR, thereby securing reliability in the calculation of the user's biometric information.

Figure 9:
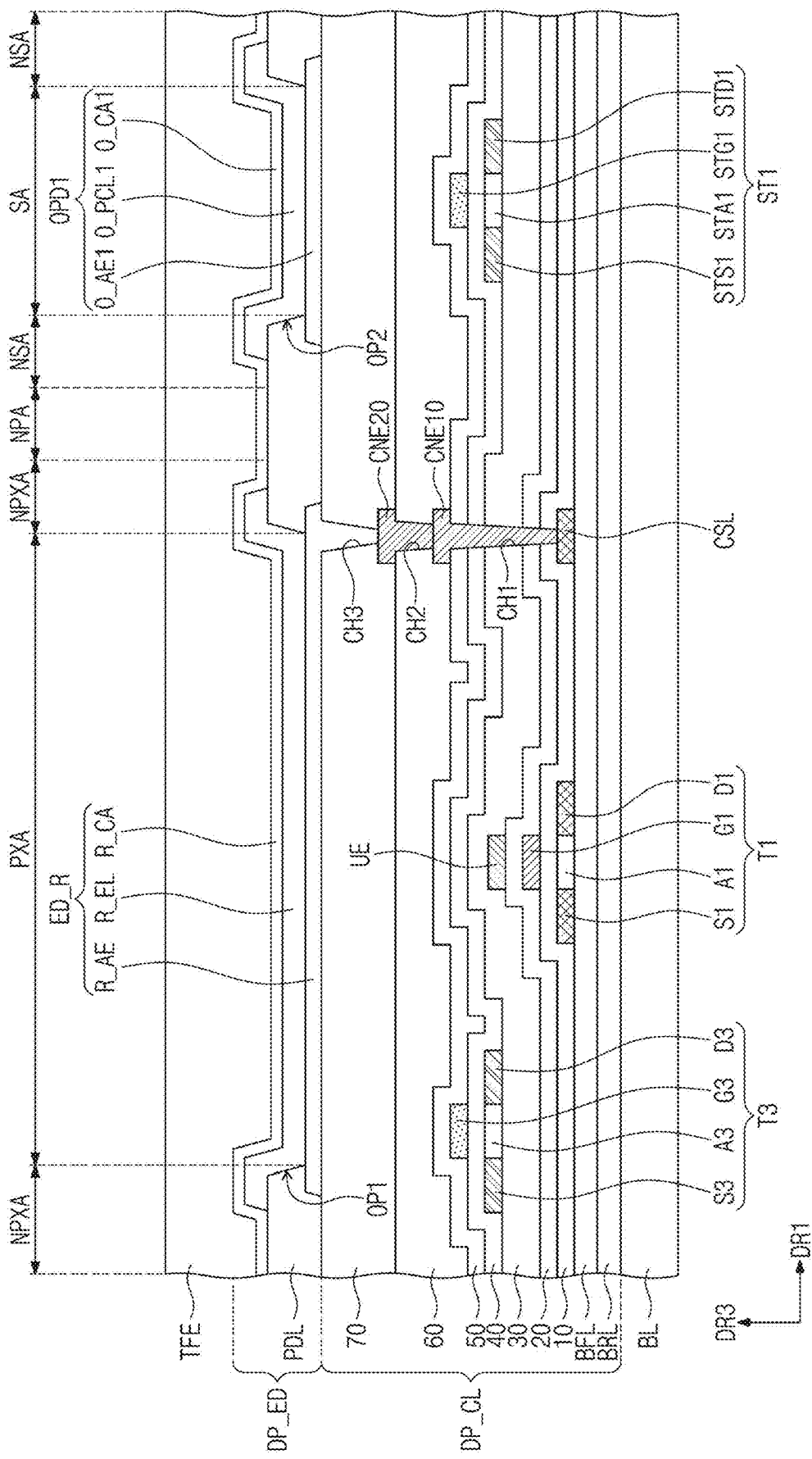
FIG. 9 is a sectional view illustrating a pixel and a sensor of the display panel according to some embodiments of the present disclosure.

FIG. 9 is a sectional view illustrating a pixel and a sensor of the display panel according to some embodiments of the present disclosure.

Referring to FIG. 9, the display panel DP may include the base layer BL, and the circuit layer DP_CL, the element layer DP_ED, and the encapsulation layer TFE located on the base layer BL.

The base layer BL may include a synthetic resin layer. The synthetic resin layer may contain a thermosetting resin. In particular, the synthetic resin layer may be a polyimide-based resin layer, and the material thereof is not particularly limited. The synthetic resin layer may contain at least one of an acrylate-based resin, a methacrylate-based resin, a polyisoprene-based resin, a vinyl-based resin, an epoxy-based resin, a urethane-based resin, a celluose-based resin, a siloxane-based resin, a polyamide-based resin, or a perylene-based resin. In addition, the base layer BL may include a glass substrate, a metal substrate, or an organic/inorganic composite substrate.

At least one inorganic layer is formed on the upper surface of the base layer BL. The inorganic layer may contain at least one of aluminum oxide, titanium oxide, silicon oxide, silicon oxy-nitride, zirconium oxide, or hafnium oxide. The inorganic layer may be formed in multiple layers. The multiple inorganic layers may constitute a barrier layer BRL and/or a buffer layer BFL that will be described below. The barrier layer BRL and the buffer layer BF may be selectively formed or arranged.

The barrier layer BRL prevents or reduces infiltration of foreign matter from the outside. The barrier layer BRL may include a silicon oxide layer and a silicon nitride layer. A plurality of silicon oxide layers and a plurality of silicon nitride layers may be provided. The silicon oxide layers and the silicon nitride layers may be alternately stacked one above another.

The buffer layer BFL may be located on the barrier layer BRL. The buffer layer BFL may improve the coupling force between the base layer BL and a semiconductor pattern and/or a conductive pattern. The buffer layer BFL may include silicon oxide layers and silicon nitride layers. The silicon oxide layers and the silicon nitride layers may be alternately stacked one above another.

A semiconductor pattern 1110 (refer to FIG. 10A) is located on the buffer layer BFL. Hereinafter, the semiconductor pattern 1110 directly located on the buffer layer BFL is defined as the first semiconductor pattern 1110. The first semiconductor pattern 1110 may include a silicon semiconductor. The first semiconductor pattern 1110 may contain poly silicon. However, without being limited thereto, the first semiconductor pattern 1110 may contain amorphous silicon. For convenience of description, only a portion of the semiconductor pattern of the red pixel PXR illustrated in FIG. 6 is illustrated in FIG. 9.

FIG. 9 merely illustrates a portion of the first semiconductor pattern 1110, and the first semiconductor pattern 1110 may be additionally located in another area of the red pixel PXR (refer to FIG. 6). The first semiconductor pattern 1110 has different electrical properties depending on whether the first semiconductor pattern 1110 is doped or not. The first semiconductor pattern 1110 may include a doped area and an undoped area. The doped area may be doped with an N-type dopant or a P-type dopant. A P-type transistor may include a doped area doped with a P-type dopant, and an N-type transistor may include a doped area doped with an N-type dopant.

The doped area has a higher conductivity than the undoped area and substantially serves as an electrode or a signal line. The undoped area substantially corresponds to an active area (or, a channel) of a transistor. In other words, one portion of the first semiconductor pattern 1110 may be an active area of a transistor, another portion may be a source or drain of the transistor, and another portion may be a connecting signal line (or, a connecting electrode).

Referring to FIGS. 6 and 9, the first electrode S1, a channel part A1, and the second electrode D1 of the first transistor T1 are formed from the first semiconductor pattern 1110. The first electrode S1 and the second electrode D1 of the first transistor T1 extend from the channel part A1 in opposite directions.

In FIG. 9, a portion of a connecting signal line CSL formed from the first semiconductor pattern 1110 is illustrated. According to some embodiments, the connecting signal line CSL may be connected to the second electrode of the seventh transistor T7 (refer to FIG. 6) on the plane (or in a plan view).

A first insulating layer 10 is located on the buffer layer BFL. The first insulating layer 10 commonly overlaps the plurality of pixels PX (refer to FIG. 3) and covers the first semiconductor pattern 1110. The first insulating layer 10 may be an inorganic layer and/or an organic layer and may have a single-layer structure or a multi-layer structure. The first insulating layer 10 may contain at least one of aluminum oxide, titanium oxide, silicon oxide, silicon oxy-nitride, zirconium oxide, or hafnium oxide. According to some embodiments, the first insulating layer 10 may be a single silicon oxide layer. Not only the first insulating layer 10 but also insulating layers of the circuit layer DP_CL to be described below may be inorganic layers and/or organic layers and may have a single-layer structure or a multi-layer structure. The inorganic layers may contain at least one of the aforementioned materials.

The third electrode G1 of the first transistor T1 is located on the first insulating layer 10. The third electrode G1 may be a portion of a metal pattern. The third electrode G1 of the first transistor T1 overlaps the channel part A1 of the first transistor T1. The third electrode G1 of the first transistor T1 may serve as a mask in a process of doping the first semiconductor pattern 1110.

A second insulating layer 20 that covers the third electrode G1 is located on the first insulating layer 10. The second insulating layer 20 commonly overlaps the plurality of pixels PX. The second insulating layer 20 may be an inorganic layer and/or an organic layer and may have a single-layer structure or a multi-layer structure. According to some embodiments, the second insulating layer 20 may be a single silicon oxide layer.

An upper electrode UE may be located on the second insulating layer 20. The upper electrode UE may overlap the third electrode G1. The upper electrode UE may be a portion of a metal pattern, or may be a portion of a doped semiconductor pattern. A portion of the third electrode G1 and the upper electrode UE overlapping the portion of the third electrode G1 may define the capacitor Cst (refer to FIG. 6). According to some embodiments of the present disclosure, the upper electrode UE may be omitted.

According to some embodiments of the present disclosure, the second insulating layer 20 may be replaced with an insulating pattern. The upper electrode UE is located on the insulating pattern. The upper electrode UE may serve as a mask that forms the insulating pattern from the second insulating layer 20.

A third insulating layer 30 that covers the upper electrode UE is located on the second insulating layer 20. According to some embodiments, the third insulating layer 30 may be a single silicon oxide layer. A semiconductor pattern 1410 (refer to FIG. 10D) is located on the third insulating layer 30. Hereinafter, the semiconductor pattern directly located on the third insulating layer 30 is defined as the third semiconductor pattern 1410. The third semiconductor pattern 1410 may contain metal oxide. An oxide semiconductor may include a crystalline or amorphous oxide semiconductor. For example, the oxide semiconductor may contain metal oxide of zinc (Zn), indium (In), gallium (Ga), tin (Sn), or titanium (Ti), or may contain metal such as zinc (Zn), indium (In), gallium (Ga), tin (Sn), or titanium (Ti) and a mixture of oxide thereof. The oxide semiconductor may contain indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), or zinc-tin oxide (ZTO).

FIG. 9 merely illustrates a portion of the third semiconductor pattern 1410, and the third semiconductor pattern 1410 may be additionally located in another area of the red pixel PXR (refer to FIG. 6). The third semiconductor pattern 1410 may include a plurality of areas distinguished depending on whether metal oxide is reduced or not. An area where metal oxide is reduced (hereinafter, referred to as the reduced area) has a higher conductivity than an area where metal oxide is not reduced (hereinafter, referred to as the non-reduced area). The reduced area substantially serves as an electrode or a signal line. The non-reduced area substantially corresponds to a channel part of a transistor. In other words, one portion of the third semiconductor pattern 1410 may be a channel part of a transistor, and another portion may be a first electrode or a second electrode of the transistor.

As illustrated in FIG. 9, the first electrode S3, a channel part A3, and the second electrode D3 of the third transistor T3 are formed from the third semiconductor pattern 1410. The first electrode S3 and the second electrode D3 contain metal reduced from a metal oxide semiconductor. The first electrode S3 and the second electrode D3 may include a metal layer having a thickness (e.g., a set or predetermined thickness) from the upper surface of the third semiconductor pattern 1410 and containing the reduced metal.

A fourth insulating layer 40 that covers the third semiconductor pattern 1410 is located on the third insulating layer 30. According to some embodiments, the fourth insulating layer 40 may be a single silicon oxide layer. The third electrode G3 of the third transistor T3 is located on the fourth insulating layer 40. The third electrode G3 may be a portion of a metal pattern. The third electrode G3 of the third transistor T3 overlaps the channel part A3 of the third transistor T3.

According to some embodiments of the present disclosure, the fourth insulating layer 40 may be replaced with an insulating pattern. The third electrode G3 of the third transistor T3 is located on the insulating pattern. According to some embodiments, the third electrode G3 may have the same shape as the insulating pattern on the plane (or in a plan view). Although one third electrode G3 is illustrated for convenience of description, the third transistor T3 may include two third electrodes.

A fifth insulating layer 50 that covers the third electrode G3 is located on the fourth insulating layer 40. According to some embodiments, the fifth insulating layer 50 may include a silicon oxide layer and a silicon nitride layer. The fifth insulating layer 50 may include a plurality of silicon oxide layers and a plurality of silicon nitride layers alternately stacked one above another.

According to some embodiments, the first electrode and the second electrode of the fourth transistor T4 (refer to FIG. 6) may be formed through the same process as the first electrode S3 and the second electrode D3 of the third transistor T3. Furthermore, the first electrode and the second electrode of the reset transistor ST1 of the sensor FX (refer to FIG. 5A) may be simultaneously formed through the same process as the first electrode S3 and the second electrode D3 of the third transistor T3.

At least one insulating layer is additionally located on the fifth insulating layer 50. According to some embodiments, a sixth insulating layer 60 and a seventh insulating layer 70 may be located on the fifth insulating layer 50. The sixth insulating layer 60 and the seventh insulating layer 70 may be organic layers and may have a single-layer structure or a multi-layer structure. Each of the sixth insulating layer 60 and the seventh insulating layer 70 may be a single polyimide-based resin layer. Without being limited thereto, the sixth insulating layer 60 and the seventh insulating layer 70 may contain at least one of an acrylate-based resin, a methacrylate-based resin, a polyisoprene-based resin, a vinyl-based resin, an epoxy-based resin, a urethane-based resin, a celluose-based resin, a siloxane-based resin, a polyamide-based resin, or a perylene-based resin.

A first connecting electrode CNE10 may be located on the fifth insulating layer 50. The first connecting electrode CNE10 may be connected to the connecting signal line CSL through a first contact hole CH1 penetrating the first to fifth insulating layers 10 to 50, and a second connecting electrode CNE20 may be connected to the first connecting electrode CNE10 through a contact hole CH2 penetrating the sixth insulating layer 60. According to some embodiments of the present disclosure, at least one of the fifth, sixth, or seventh insulating layers 50, 60, or 70 may be omitted.

The element layer DP_ED includes the red light emitting element ED_R and a pixel defining film PDL. The red anode electrode R_AE of the red light emitting element ED_R is located on the seventh insulating layer 70. The red anode electrode R_AE of the red light emitting element ED_R may be connected with the second connecting electrode CNE20 through a third contact hole CH3 penetrating the seventh insulating layer 70.

A first opening OP1 of the pixel defining film PDL exposes at least a portion of the red anode electrode R_AE of the red light emitting element ED_R. The first opening OP1 of the pixel defining film PDL may define an emissive area PXA. For example, the plurality of pixels PX (refer to FIG. 3) may be located on the plane of the display panel DP (refer to FIG. 3) according to a rule (e.g., a set or predetermined rule). The area where the plurality of pixels PX are arranged may be defined as a pixel area, and one pixel area may include an emissive area PXA and a non-emissive area NPXA adjacent to the emissive area PXA. The non-emissive area NPXA may surround the emissive area PXA.

The red light emitting layer R_EL is located on the red anode electrode R_AE. The red light emitting layer R_EL may be located only in the area corresponding to the first opening OP1. The red light emitting layer R_EL may be separately formed in each of the plurality of pixels PX. Although the patterned red light emitting layer R_EL is illustrated, embodiments according to the present disclosure are not limited thereto. A common light emitting layer may be commonly arranged for the plurality of pixels PX. In this case, the common light emitting layer may generate white light or blue light.

The red cathode electrode R_CA may be located on the red light emitting layer R_EL. The red cathode electrode R_CA is commonly arranged for the plurality of pixels PX.

According to some embodiments, a hole transporting layer and a hole injection layer may be additionally located between the red anode electrode R_AE and the red light emitting layer R_EL. Furthermore, an electron transporting layer and an electron injection layer may be additionally located between the red light emitting layer R_EL and the red cathode electrode R_CA.

The encapsulation layer TFE is located on the red cathode electrode R_CA. The encapsulation layer TFE may cover the plurality of pixels PX. According to some embodiments, the encapsulation layer TFE directly covers the red cathode electrode R_CA. According to some embodiments of the present disclosure, the display panel DP may further include a capping layer that directly covers the red cathode electrode R_CA. According to some embodiments of the present disclosure, the stacked structure of the red light emitting element ED_R may have a structure in which the structure illustrated in FIG. 9 is inverted.

As illustrated in FIG. 9, the circuit layer DP_CL may further include a portion of a semiconductor pattern of the sensor drive circuit O_SD (refer to FIG. 6). For convenience of description, the reset transistor ST1 of the semiconductor pattern of the sensor drive circuit O_SD is illustrated. The first electrode STS1, a channel part STA1, and the second electrode STD1 of the reset transistor ST1 are formed from a fourth semiconductor pattern 1420. According to some embodiments of the present disclosure, the fourth semiconductor pattern 1420 (refer to FIG. 10D) may contain metal oxide such as the third semiconductor pattern 1410. The fourth semiconductor pattern 1420 may be formed through the same process as the third semiconductor pattern 1410. The first electrode STS1 and the second electrode STD1 contain metal reduced from a metal oxide semiconductor. The first electrode STS1 and the second electrode STD1 may include a metal layer having a thickness (e.g., a set or predetermined thickness) from the upper surface of the fourth semiconductor pattern 1420 and containing the reduced metal. The fourth insulating layer 40 is arranged to cover the first electrode STS1, the channel part STA1, and the second electrode STD1 of the reset transistor ST1. The third electrode STG1 of the reset transistor ST1 is located on the fourth insulating layer 40. According to some embodiments, the third electrode STG1 may be a portion of a metal pattern. The third electrode STG1 of the reset transistor ST1 overlaps the channel part STA1 of the reset transistor T1. Although one third electrode STG1 is illustrated for convenience of description, the first reset transistor ST1 may include two third electrodes.

According to some embodiments of the present disclosure, the reset transistor ST1 may be located on the same layer as the third transistor T3. That is, the first electrode STS1, the channel part STA1, and the second electrode STD1 of the reset transistor ST1 may be formed through the same process as the first electrode S3, the channel part A3, and the second electrode D3 of the third transistor T3. The third electrode STG1 of the reset transistor ST1 and the third electrode G3 of the third transistor T3 may be simultaneously formed through the same process. According to some embodiments, the first electrodes and the second electrodes of the amplifying transistor ST2 and the output transistor ST3 of the sensor drive circuit O_SD may be formed through the same process as the first electrode S1 and the second electrode D1 of the first transistor T1. The reset transistor ST1 and the third transistor T3 may be formed on the same layer through the same process, and thus an additional process for forming the reset transistor ST1 is not required. Accordingly, process efficiency may be improved, and cost savings may be achieved. Specifically, the third electrode STG1 of the reset transistor ST1 corresponds to the j-th sensing control line CLj of FIG. 6. The third electrode G3 of the third transistor T3 corresponds to the j-th compensation scan line SCLj of FIG. 6. Accordingly, even though the j-th sensing control line CLj for providing the sensing control signal CS different from the j-th compensation scan signal SCj provided to the red pixel PXR (refer to FIG. 6) is additionally formed in the sensor FX (refer to FIG. 6), an additional process for forming only the j-th sensing control line CLj is not required, and thus high process efficiency and cost savings may be achieved.

The element layer DP_ED may further include the first and second light sensing elements OPD1 and OPD2 (refer to FIG. 6). For convenience of description, only the first light sensing element OPD1 is illustrated in FIG. 9. The first sub-anode electrode O_AE1 of the first light sensing element OPD1 is located on the seventh insulating layer 70. According to some embodiments, the first sub-anode electrode O_AE1 may be electrically connected with the second electrode STD1 of the reset transistor ST1 through a contact hole penetrating the fourth to seventh insulating layers 40 to 70 on the plane (or in a plan view).

A second opening OP2 of the pixel defining film PDL exposes at least a portion of the first sub-anode electrode O_AE1 of the first light sensing element OPD1. The second opening OP2 of the pixel defining film PDL may define a sensing area SA. When the area where the first photoelectric conversion layer O_PCL1 is located is referred to as the sensing area SA, an area around the sensing area SA may be defined as a non-sensing area NSA. According to some embodiments, a non-pixel area NPA may be defined between the non-sensing area NSA and the non-emissive area NPXA.

FIGS. 10A to 10H are plan views illustrating layers of patterns constituting the pixel drive circuit and the sensor drive circuit of FIG. 6.

Referring to FIGS. 10A to 10H, conductive patterns and semiconductor patterns may be repeatedly arranged on the plane according to a rule (e.g., a set or predetermined rule).

FIGS. 10A to 10H illustrate plan views of a part of pixel drive circuits and a part of a sensor drive circuit.

A first portion PDC1 and a second portion PDC2 may have structures symmetrical to each other. The first portion PDC1 and the second portion PDC2 may constitute pixel drive circuits. A third portion SDC may constitute sensor drive circuits.

Although FIGS. 10A to 10H illustrate the first portion PDC1 and the second portion PDC2 having the symmetrical structures, the same structure as the first portion PDC1 may be continuously repeated, or the same structure as the second portion PDC2 may be continuously repeated. Furthermore, the first portion PCD1, the second portion PDC2, and the third portion SDC illustrated in FIGS. 10A to 10h may be repeatedly arranged in the first direction DR1 and the second direction DR2. However, embodiments according to the present disclosure are not limited thereto. In the following description of FIGS. 10A to 10H, for convenience, only components included in the pixel drive circuit included in the first portion PDC1 will be described.

Figure 10A:
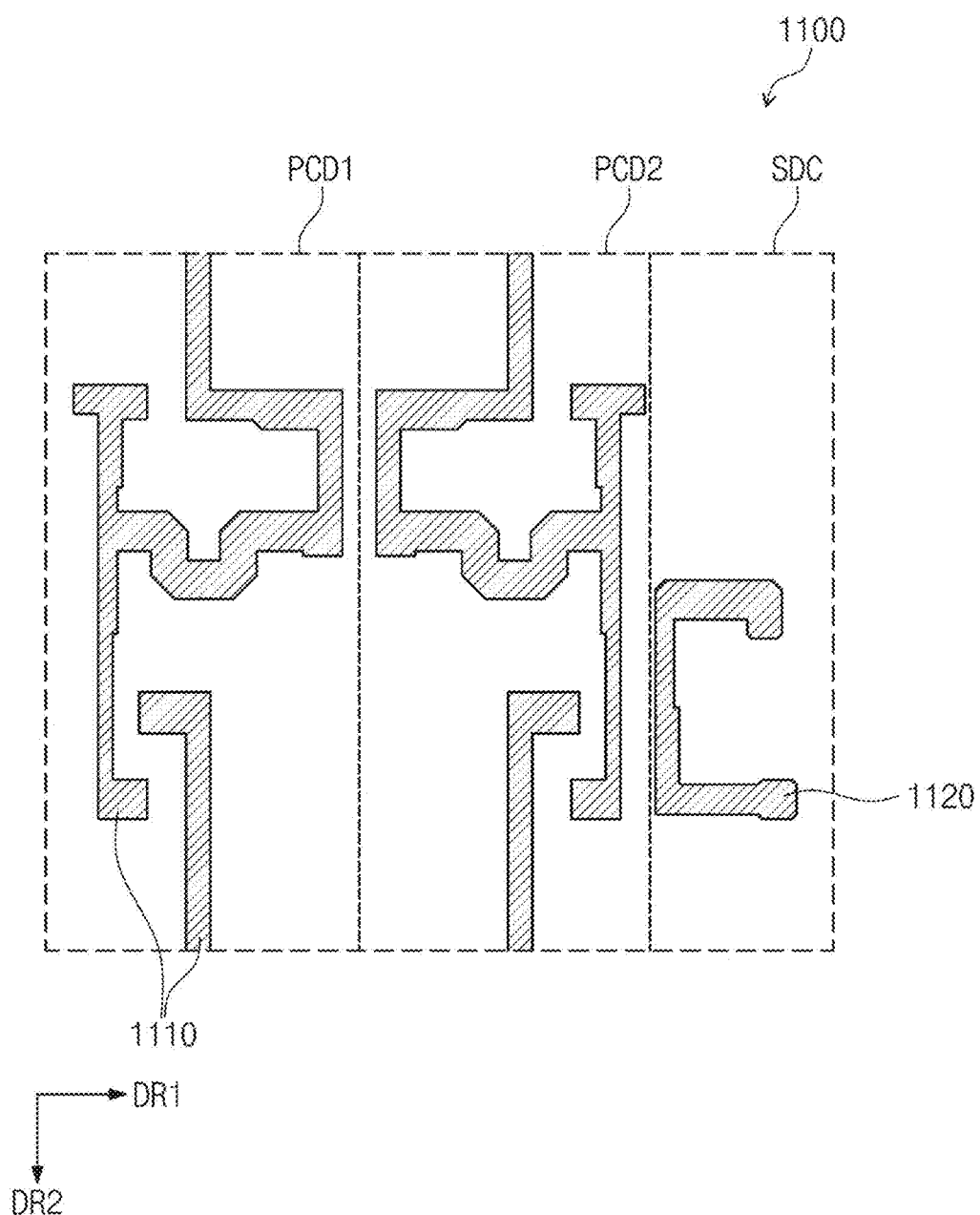
FIGS. 10A to 10H are plan views illustrating layers of conductive patterns constituting the pixel drive circuit and the sensor drive circuit of FIG. 6.

Referring to FIGS. 9 and 10A, a first semiconductor layer 1100 is illustrated. The first semiconductor layer 1100 may be located between the buffer layer BFL and the first insulating layer 10. The first semiconductor layer 1100 may include a silicon semiconductor. For example, the silicon semiconductor may contain amorphous silicon or polycrystalline silicon. For example, the first semiconductor layer 1100 may contain low-temperature polycrystalline silicon (LTPS).

The first semiconductor layer 1100 includes the first semiconductor pattern 1110 included in the first and second portions PDC1 and PDC2 and a second semiconductor pattern 1120 included in the third portion SDC.

Figure 10B:
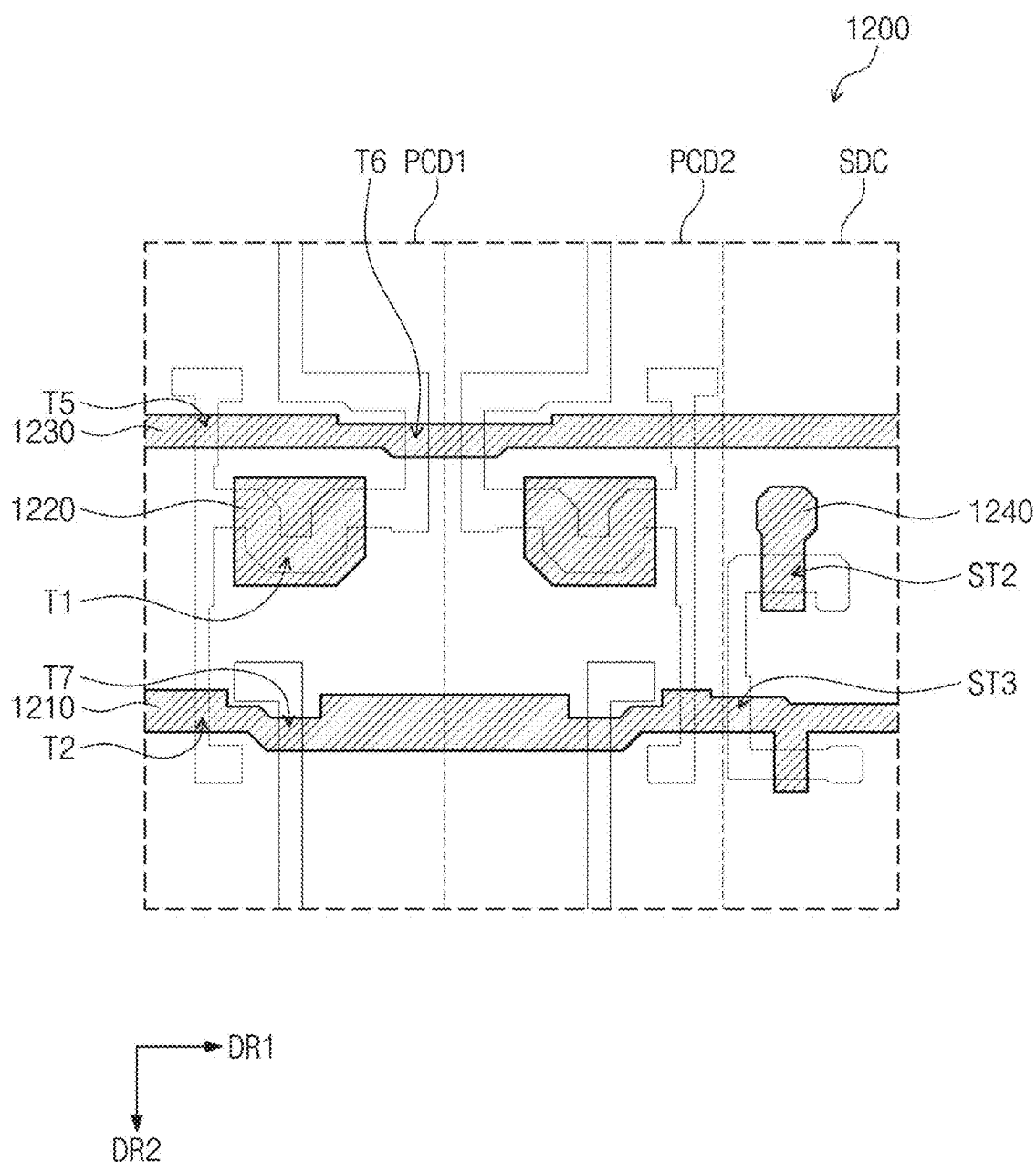

Referring to FIGS. 9, 10A, and 10B, a first conductive layer 1200 may be located on the first insulating layer 10. The first conductive layer 1200 may contain metal, an alloy, conductive metal oxide, or a transparent conductive material. For example, the first conductive layer 1200 may contain silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), indium tin oxide (ITO), or indium zinc oxide (IZO), but is not particularly limited thereto.

The first conductive layer 1200 may include a first gate wire 1210, a first gate electrode 1220, and a second gate wire 1230.

The first gate wire 1210 may extend in the first direction DR1. The first gate wire 1210 corresponds to the j-th write scan line SWLj of FIG. 6. For example, the j-th write scan signal SWj (refer to FIG. 6) may be provided to the first gate wire 1210.

The first gate wire 1210 may constitute the second transistor T2 of FIG. 6 together with the first semiconductor pattern 1110. Furthermore, the first gate wire 1210 may constitute the seventh transistor T7 of FIG. 6 together with the first semiconductor pattern 1110. The first gate wire 1210 may constitute the output transistor ST3 of FIG. 6 together with the second semiconductor pattern 1120.

The first gate electrode 1220 may be arranged in an island shape. The first gate electrode 1220 may constitute the first transistor T1 of FIG. 6 together with the first semiconductor pattern 1110. The first gate electrode 1220 may correspond to the third electrode G1 of the first transistor T1 illustrated in FIG. 9.

The second gate wire 1230 may extend in the first direction DR1. The second gate wire 1230 may correspond to the j-th light emission control line EMLj of FIG. 6. For example, the j-th light emission control signal Emj (refer to FIG. 6) may be provided to the second gate wire 1230. The second gate wire 1230 may constitute the fifth and sixth transistors T5 and T6 of FIG. 6 together with the first semiconductor pattern 1110.

A second gate electrode 1240 may be arranged in an island shape. The second gate electrode 1240 may constitute the amplifying transistor ST2 of FIG. 6 together with the second semiconductor pattern 1120.

Figure 10C:
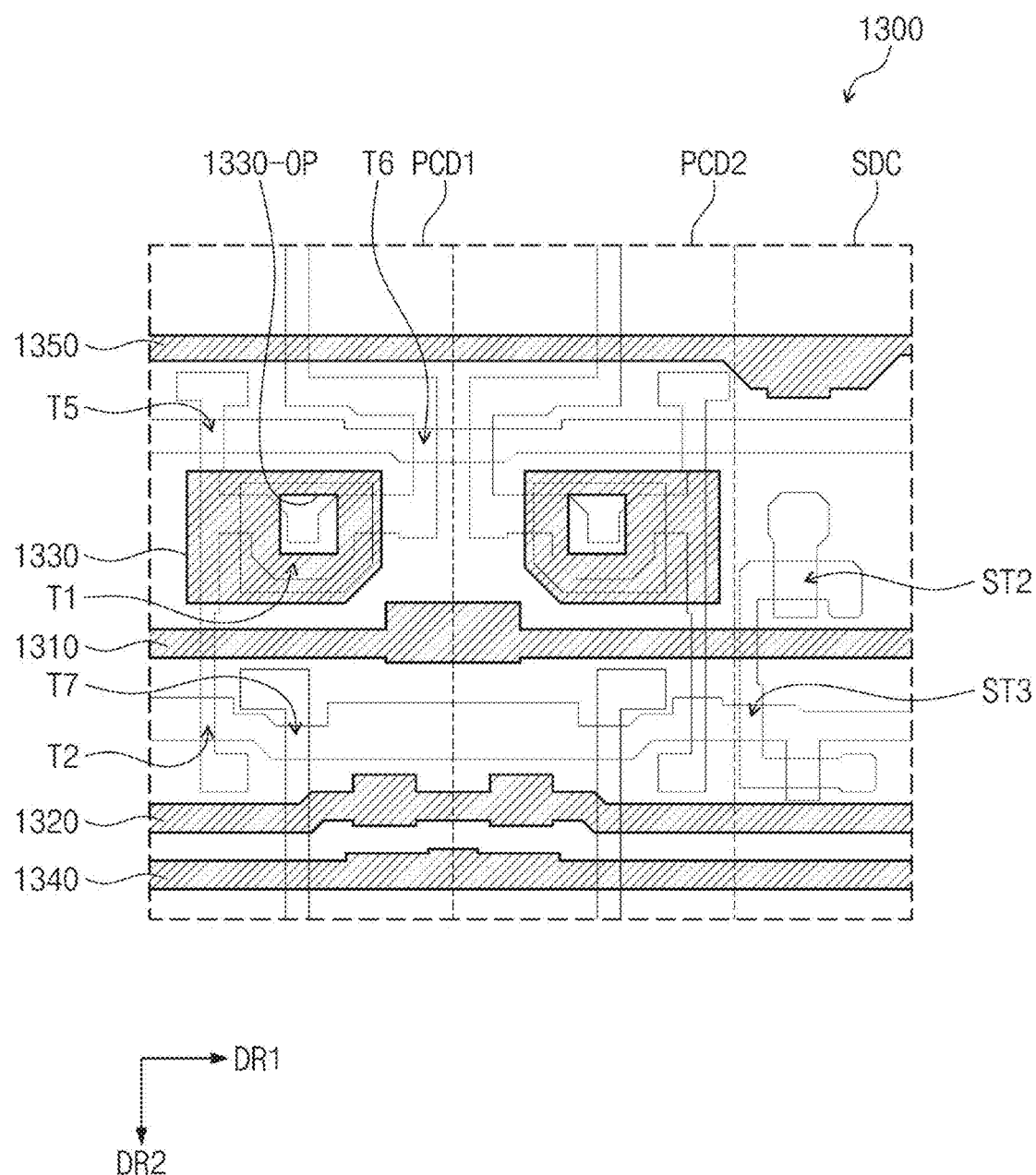

Referring to FIGS. 9, 10B, and 10C, the second insulating layer 20 may cover the first conductive layer 1200 and may be located on the first insulating layer 10. A second conductive layer 1300 may be located on the second insulating layer 20. The second conductive layer 1300 may contain metal, an alloy, conductive metal oxide, or a transparent conductive material.

The second conductive layer 1300 may include a third gate wire 1310, a fourth gate electrode 1320, a capacitor electrode 1330, a first initialization voltage line 1340, and a second initialization voltage line 1350.

The third gate wire 1310 may extend in the first direction DR1. The third gate wire 1310 may correspond to the j-th compensation scan line SCLj (refer to FIG. 6). The fourth gate wire 1320 may extend in the first direction DR1. The fourth gate wire 1320 may correspond to the j-th initialization scan line SILj (refer to FIG. 6). The capacitor electrode 1330 may overlap the first gate electrode 1220 and may be arranged in an island shape. For example, the capacitor electrode 1330 may constitute the capacitor Cst (refer to FIG. 6) together with the first gate electrode 1220. The capacitor electrode 1330 may correspond to the upper electrode UE. The drive voltage ELVDD (refer to FIG. 6) may be provided to the capacitor electrode 1330. Furthermore, an opening 1330-OP penetrating the capacitor electrode 1330 may be formed in the capacitor electrode 1330, and the first gate electrode 1220 may be exposed through the hole.

The first initialization voltage line 1340 may extend in the first direction DR1. The first initialization voltage line 1340 may correspond to the first initialization voltage line VL3 of FIG. 6. The first initialization voltage VINT1 (refer to FIG. 6) may be provided through the first initialization voltage line 1340. The second initialization voltage line 1350 may extend in the first direction DR1. The second initialization voltage line 1350 may correspond to the second initialization voltage line VL4 of FIG. 6. The second initialization voltage VINT2 (refer to FIG. 6) may be provided through the second initialization voltage line 1350.

Figure 10D:
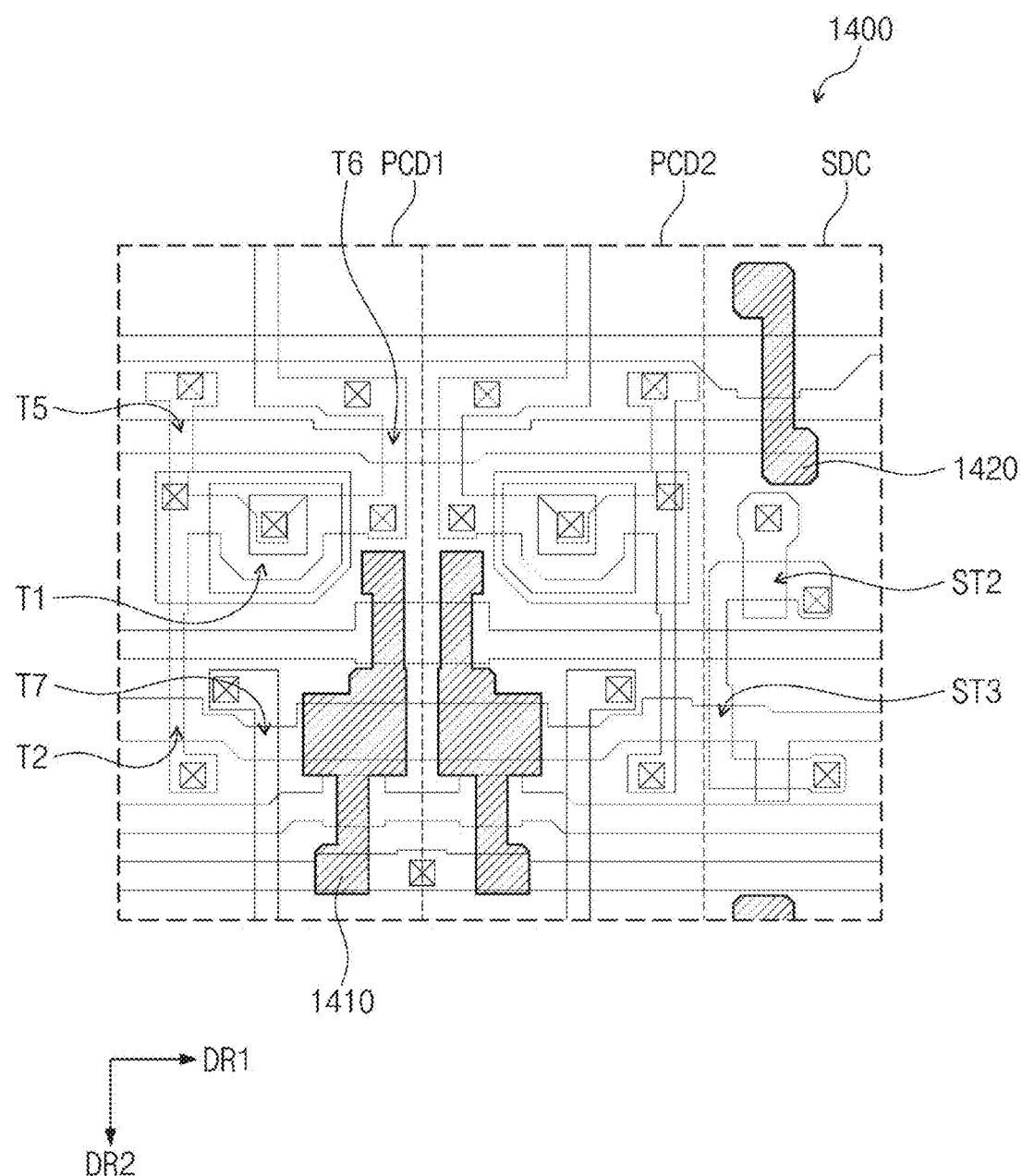
Figure 10E:
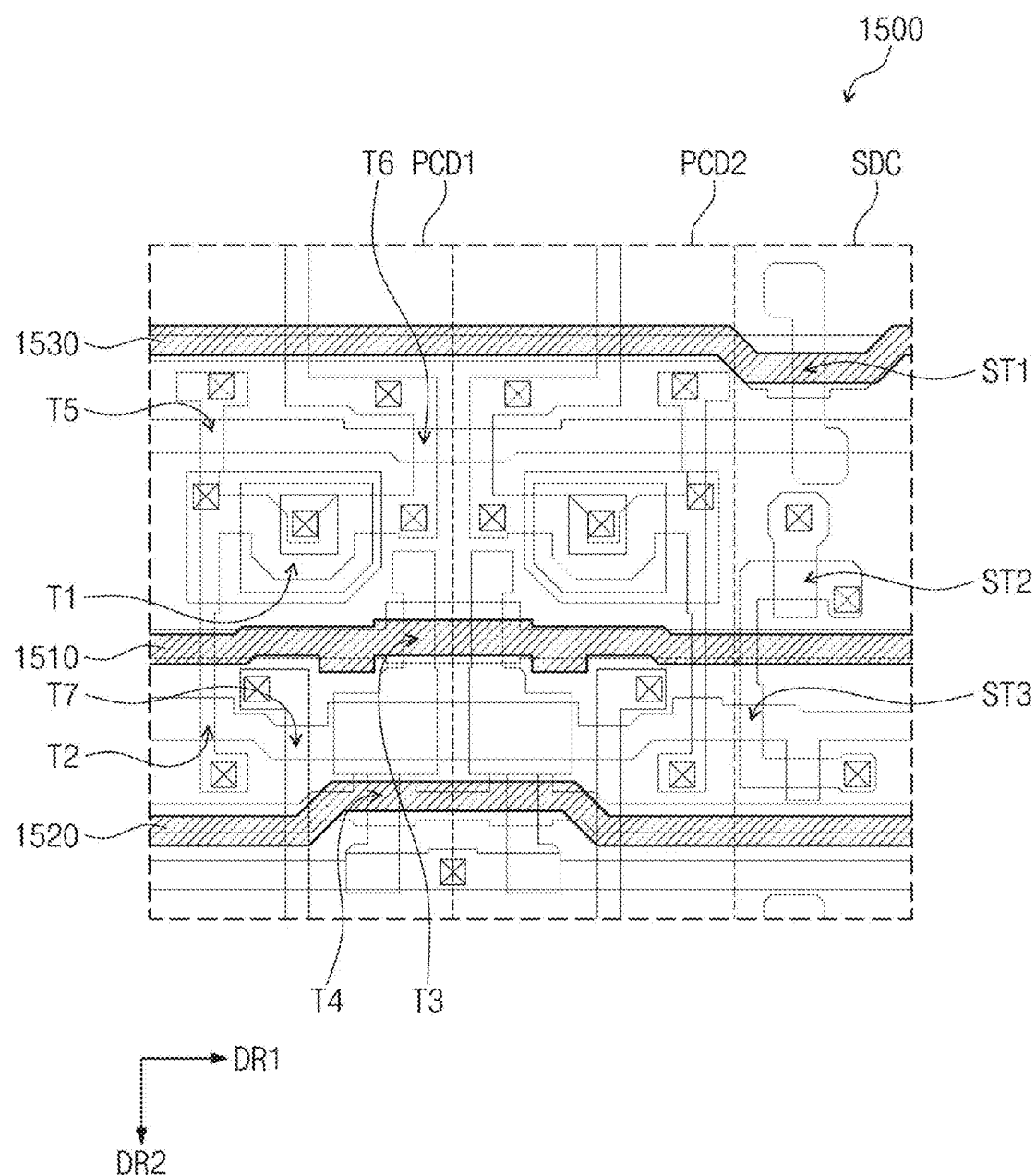

Referring to FIGS. 9, 10C, and 10D, the third insulating layer 30 may cover the second conductive layer 1300 and may be located on the second insulating layer 20. A second semiconductor layer 1400 may be located on the third insulating layer 30. The second semiconductor layer 1400 may include an oxide semiconductor. The second semiconductor layer 1400 may be located in a different layer from the first semiconductor layer 1100 and may not overlap the first semiconductor layer 1100.

The second semiconductor layer 1400 includes the third semiconductor pattern 1410 included in the first and second portions PDC1 and PDC2 and the fourth semiconductor pattern 1420 included in the third portion SDC.

Referring to FIGS. 9 and 10C to 10E, the fourth insulating layer 40 may cover the second conductor layer 1400 and may be located on the third insulating layer 30. A third conductive layer 1500 may be located on the fourth insulating layer 40. The third conductive layer 1500 may contain metal, an alloy, conductive metal oxide, or a transparent conductive material.

The third conductive layer 1500 may include a fifth gate wire 1510, a sixth gate wire 1520, and a seventh gate wire 1530.

The fifth gate wire 1510 may extend in the first direction DR1. The fifth gate wire 1510 may overlap the third gate wire 1310 and the third semiconductor pattern 1410. In some embodiments, the fifth gate wire 1510 may make contact with the third gate wire 1310 through a contact portion. Accordingly, the j-th compensation scan signal SCj applied to the third gate wire 1310 may be provided to the fifth gate wire 1510. The third gate wire 1310, the third semiconductor pattern 1410, and the fifth gate wire 1510 may constitute the third transistor T3 of FIG. 6.

The sixth gate wire 1520 may extend in the first direction DR1. The sixth gate wire 1520 may overlap the fourth gate wire 1320 and the third semiconductor pattern 1410. The sixth gate wire 1520 may be electrically connected with the fourth gate wire 1320. The j-th initialization scan signal SIj may be provided to the sixth gate wire 1520. The fourth gate wire 1320, the sixth gate wire 1520, and the third semiconductor pattern 1410 may constitute the fourth transistor T4 of FIG. 6.

The seventh gate wire 1530 may extend in the first direction DR1. The seventh gate wire 1530 may be electrically connected with the fifth gate wire 1510. The seventh gate wire 1530 may be spaced apart from the fifth gate wire 1510 in the second direction DR2. The seventh gate wire 1530 may be electrically insulted from the sixth gate wire 1520. The seventh gate wire 1530 may be spaced apart from the sixth gate wire 1520 in the second direction DR2. The seventh gate wire 1530 may correspond to the j-th sensing control line CLj of FIG. 6. The sensing control signal CS (refer to FIG. 6) may be provided through the seventh gate wire 1530. The seventh gate wire 1530 may overlap the fourth semiconductor pattern 1420. The seventh gate wire 1530 may constitute the reset transistor ST1 of FIG. 6 together with the fourth semiconductor pattern 1420.

Figure 10F:
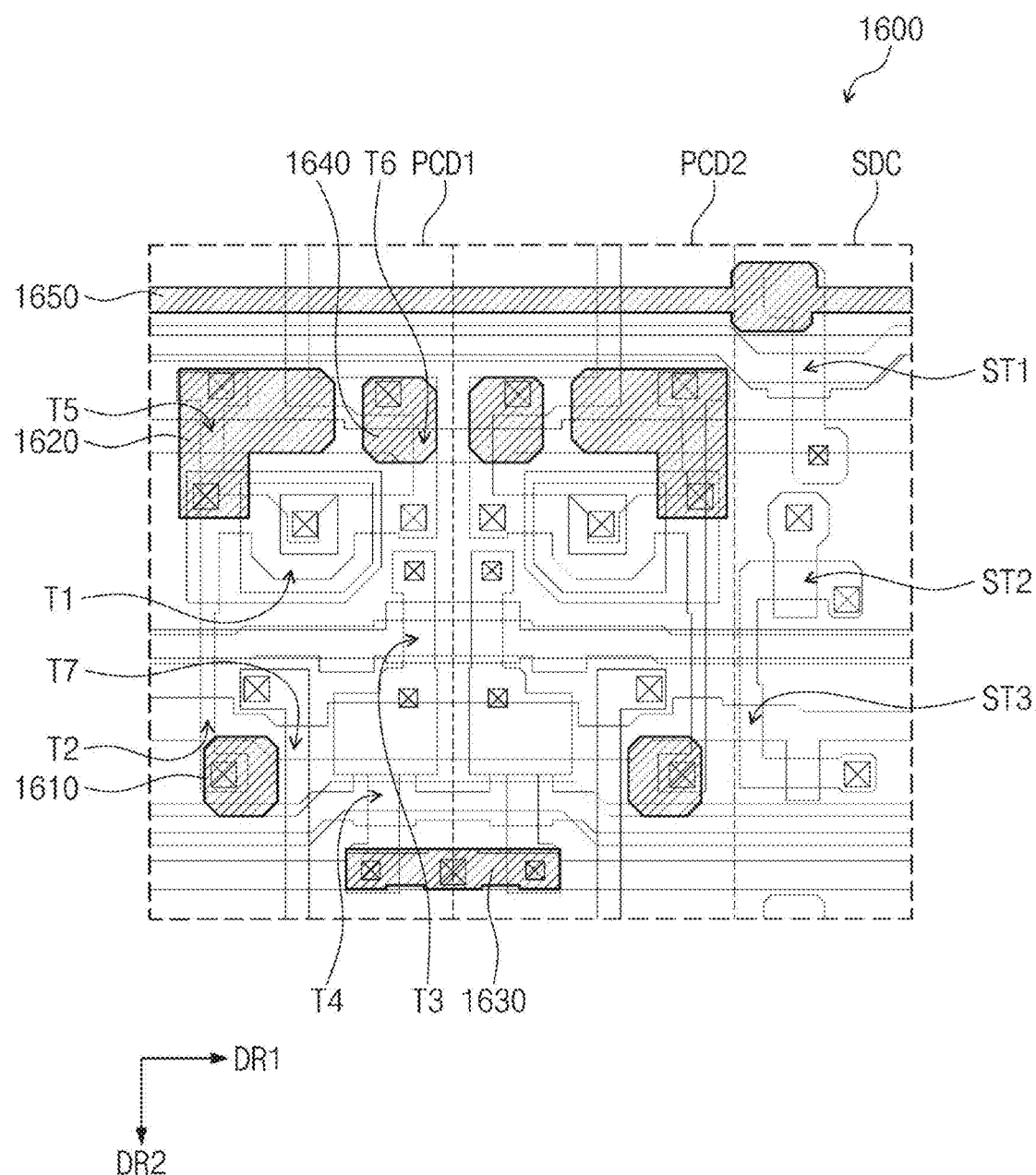

Referring to FIGS. 9 and 10A to 10F, the fifth insulating layer 50 may cover at least a portion of the third conductive layer 1500 and may be located on the fourth insulating layer 40. A fourth conductive layer 1600 may be located on the fifth insulating layer 50. The fourth conductive layer 1600 may contain, for example, metal, an alloy, conductive metal oxide, or a transparent conductive material. Hereinafter, for convenience of description, only some of the components included in the fourth conductive layer 1600 are illustrated in FIG. 10F.

The fourth conductive layer 1600 may include a second transfer pattern 1610, a third transfer pattern 1620, a fourth transfer pattern 1630, a fifth transfer pattern 1640, and a first reset wire 1650.

The second transfer pattern 1610 may make contact with the first semiconductor pattern 1110. The i-th data signal Di (refer to FIG. 6) may be transferred to the first semiconductor pattern 1110 through the second transfer pattern 1610.

The third transfer pattern 1620 may make contact with the first semiconductor pattern 1110 and the capacitor electrode 1330 through contact portions formed on opposite sides of the third transfer pattern 1620. The drive voltage ELVDD (refer to FIG. 6) may be transferred to the first semiconductor pattern 1110 through the third transfer pattern 1620.

The fourth transfer pattern 1630 may make contact with the third semiconductor pattern 1410 and the first initialization voltage line 1340 through a contact portion. Accordingly, the first initialization voltage VINT1 may be transferred to the fourth transistor T4 through the fourth transfer pattern 1630.

The fifth transfer pattern 1640 may make contact with the first semiconductor pattern 1110 through a contact portion. The fifth transfer pattern 1640 may transfer the drive current Id (refer to FIG. 6) from the first semiconductor pattern 1110 to the red light emitting element ED_R (refer to FIG. 6).

The first reset wire 1650 may extend in the first direction DR1. The first reset wire 1650 may correspond to the reset receiving line VL5 of FIG. 5. According to some embodiments of the present disclosure, the reset receiving line VL5 includes a first reset line extending in the first direction DR1. The first reset wire 1650 may correspond to the first reset line. For example, the reset voltage VRST (refer to FIG. 6) may be provided to the first reset wire 1650. The first reset wire 1650 may be connected with the reset transistor ST1 through a contact portion. The reset transistor ST1 may receive the reset voltage VRST through the first reset wire 1650. However, unlike in FIG. 10F, the first reset wire 1650 may be connected with the fourth gate wire 1320 through a contact portion. In this case, the reset transistor ST1 may receive the j-th initialization scan signal SIj as the reset voltage VRST through the first reset wire 1650.

Referring to FIGS. 9 and 10A to 10G, the sixth insulating layer 60 may cover at least a portion of the fourth conductive layer 1600 and may be located on the fifth insulating layer 50. A fifth conductive layer 1700a may be located on the sixth insulating layer 60. The fifth conductive layer 1700a may contain, for example, metal, an alloy, conductive metal oxide, or a transparent conductive material.

The fifth conductive layer 1700a may include a data signal wire 1710, a drive voltage wire 1720, a connecting pattern 1730, and a sensing signal wire 1740.

The data signal wire 1710 may extend in the second direction DR2. The data signal wire 1710 may correspond to the i-th data line DLi of FIG. 6. For example, the i-th data signal Di may be provided to the data signal wire 1710. The data signal wire 1710 may make contact with the second transfer pattern 1610 through a contact portion.

The drive voltage wire 1720 may extend in the second direction DR2 and may be formed to overlap the first portion PDC1 and the second portion PDC2. The drive voltage wire 1720 may correspond to the first drive voltage line VL1 of FIG. 6. For example, the first drive voltage ELVDD may be provided to the drive voltage wire 1720. The drive voltage wire 1720 may make contact with the third transfer pattern 1620 through a contact portion.

The connecting pattern 1730 may be arranged in an island shape. The connecting pattern 1730 may make contact with the fourth semiconductor pattern 1420 through a contact portion formed on one side of the connecting pattern 1730. According to some embodiments, the connecting pattern 1730 may make contact with the first and second light sensing elements OPD1 and OPD2 of FIG. 6 through a contact portion formed on an opposite side of the connecting pattern 1730.

The sensing signal wire 1740 may extend in the second direction DR2. The sensing signal wire 1740 may correspond to the d-th sensing line RLd of FIG. 6. For example, the d-th sensing signal FSd may be transferred to the sensing signal wire 1740. The sensing signal wire 1740 may make contact with the output transistor ST3 through a contact portion.

Figure 10G:
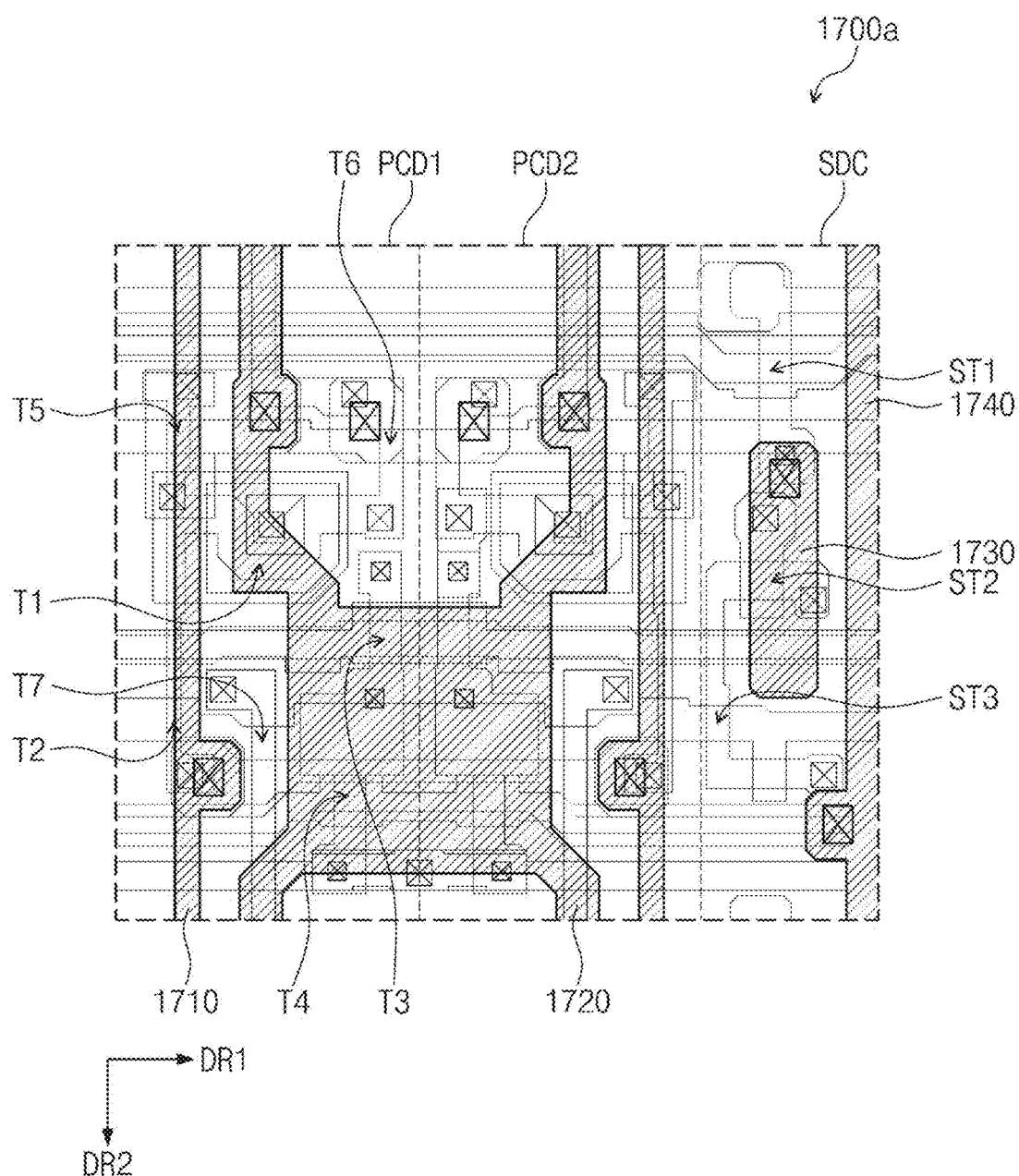
Figure 10H:
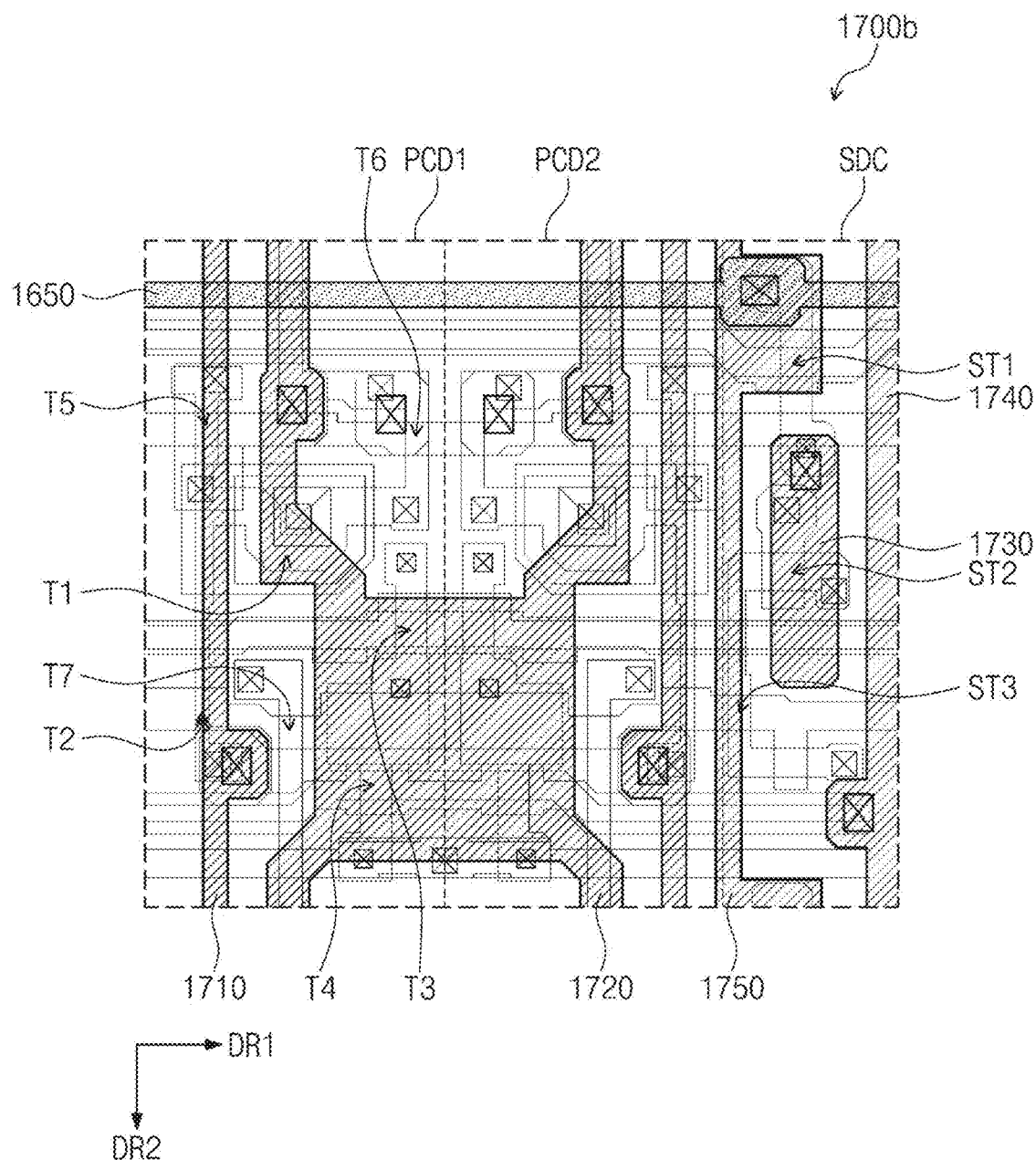

Although FIGS. 10F and 10G illustrate one example that the fifth conductive layer 1700a includes only the first reset wire 1650 corresponding to the first reset line that is included in the reset receiving line VL5 and that extends in the first direction DR1, embodiments according to the present disclosure are not limited thereto. Referring to FIG. 10H to be described below, a fifth conductive layer 1700b may further include a second reset wire 1750 corresponding to a second reset line that is included in the reset receiving line VL5 and that extends in the second direction DR2.

Referring to FIGS. 9 and 10H, the fifth conductive layer 1700b may include the data signal wire 1710, the drive voltage wire 1720, the connecting pattern 1730, the sensing signal wire 1740, and the second reset wire 1750. Hereinafter, components identical to the components described with reference to FIG. 10G will be assigned with identical reference numerals, and descriptions thereabout will be omitted.

The second reset wire 1750 may extend in the second direction DR2. The second reset wire 1750 may be spaced apart from the data signal wire 1710 in the first direction DR1. The second reset wire 1750 may be spaced apart from the sensing signal wire 1740 in the first direction DR1. The second reset wire 1750 may correspond to the reset receiving line VL5 of FIG. 5. According to some embodiments of the present disclosure, the reset receiving line VL5 includes the second reset line extending in the second direction DR2. The second reset wire 1750 may correspond to the second reset line.

The second reset wire 1750 may make contact with the first reset wire 1650 through a contact portion. The first reset wire 1650 and the second reset wire 1750 may be electrically connected with each other. The first and second reset wires 1650 and 1750 connected with each other may form a mesh shape. The reset voltage VRST (refer to FIG. 6) may be provided to the first reset wire 1650 and the second reset wire 1750. The first reset wire 1650 and the second reset wire 1750 may be connected with the reset transistor ST1 through a contact portion. The resistances of the first reset wire 1650 and the second reset wire 1750 that have a mesh shape may be lower than the resistance of the first reset wire 1650 when only the first reset wire 1650 is formed. Accordingly, in the case of forming the first reset wire 1650 and the second reset wire 1750 that have a mesh shape, power required to provide the reset voltage VRST to the reset transistor ST1 may be reduced.

Figure 11A:
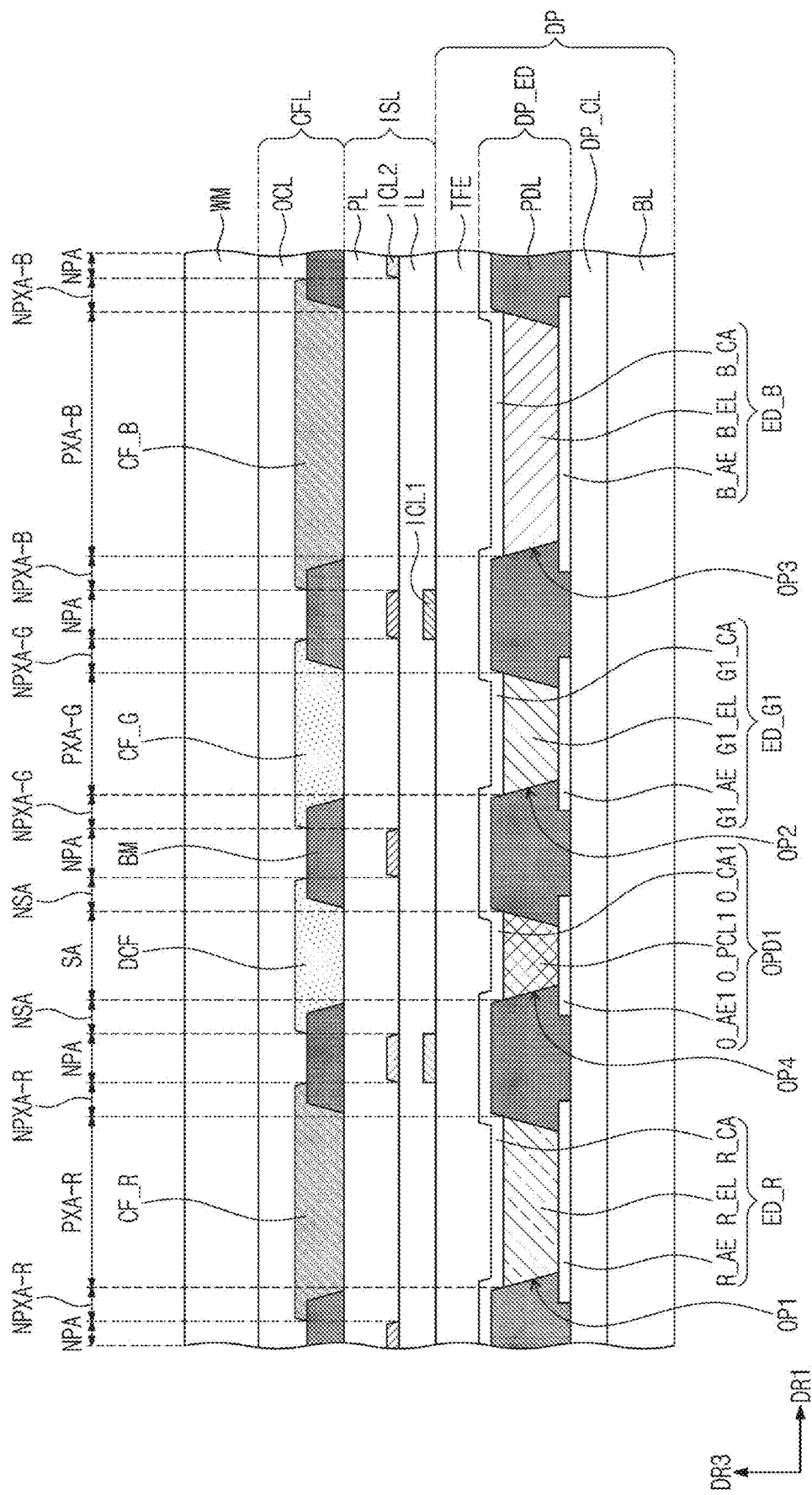
FIGS. 11A and 11B are sectional views illustrating a light emitting element and a light sensing element of the display panel according to some embodiments of the present disclosure.
Figure 11B:
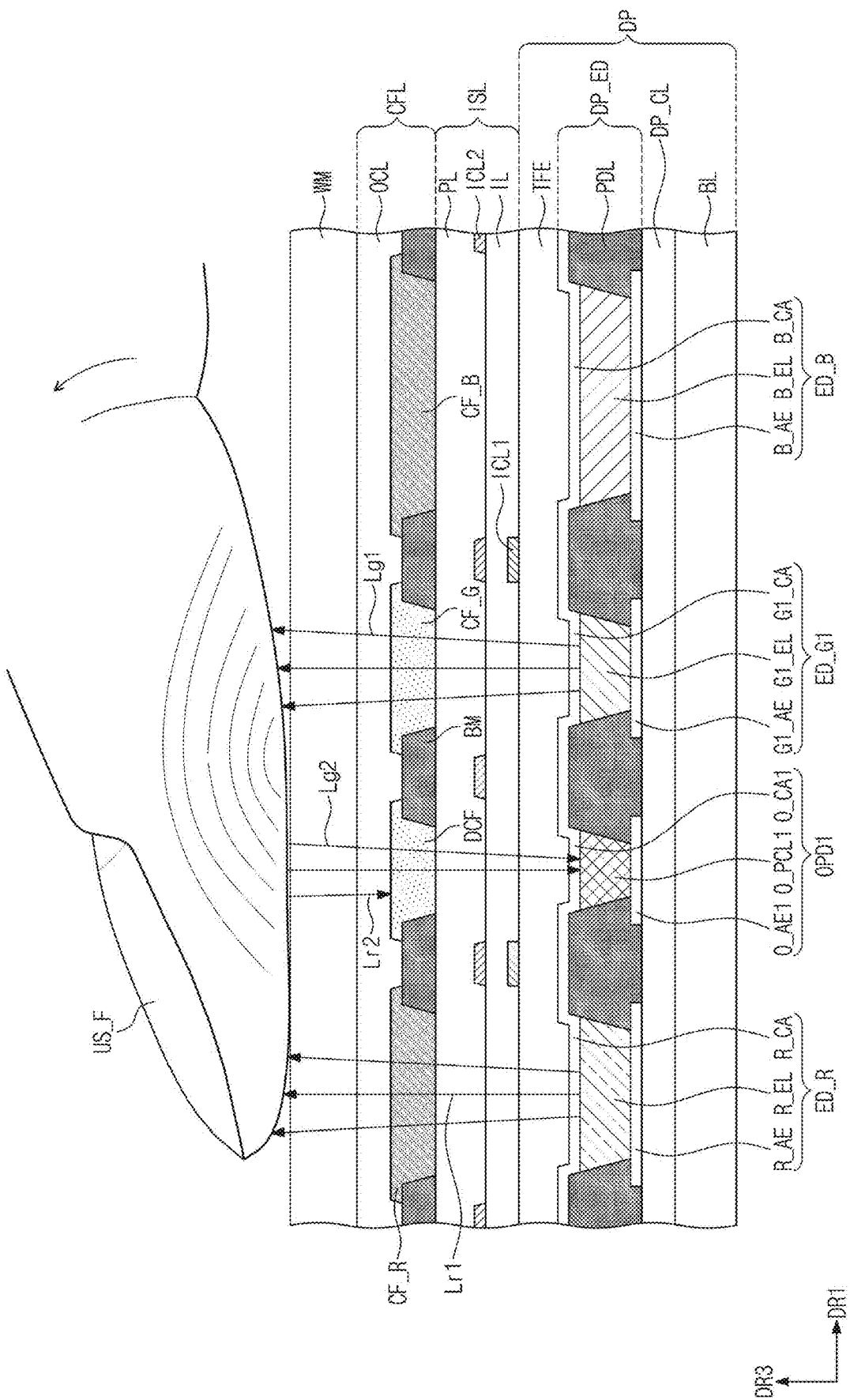

FIGS. 11A and 11B are sectional views illustrating a light emitting element and a light sensing element of the display panel according to some embodiments of the present disclosure.

Referring to FIGS. 11A and 11B, a first electrode layer is located on the circuit layer DP_CL. The pixel defining film PDL is formed on the first electrode layer. The first electrode layer may include the red, green, and blue anodes R_AE, G_AE1, and B_AE. First to third openings OP1, OP2, and OP3 of the pixel defining film PDL expose at least portions of the red, green, and blue anodes R_AE, G_AE1, and B_AE, respectively. According to some embodiments of the present disclosure, the pixel defining film PDL may additionally contain a black material. The pixel defining film PDL may additionally contain a black organic dye/pigment, such as carbon black, aniline black, or the like. The pixel defining film PDL may be formed by mixing a blue organic material and a black organic material. The pixel defining film PDL may additionally contain a liquid-repellent organic material.

As illustrated in FIG. 11A, the display panel DP may include first to third emissive areas PXA-R, PXA-G, and PXA-B and first to third non-emissive areas NPXA-R, NPXA-G, and NPXA-B adjacent to the first to third emissive areas PXA-R, PXA-G, and PXA-B. The non-emissive areas NPXA-R, NPXA-G, and NPXA-B may surround the corresponding emissive areas PXA-R, PXA-G, and PXA-B, respectively. According to some embodiments, the first emissive area PXA-R is defined to correspond to a partial area of the red anode electrode R_AE exposed by the first opening OP1. The second emissive area PXA-G is defined to correspond to a partial area of the first green anode electrode G1_AE exposed by the second opening OP2. The third emissive area PXA-B is defined to correspond to a partial area of the blue anode electrode B_AE exposed by the third opening OP3. A non-pixel area NPA may be defined between the first to third non-emissive areas NPXA-R, NPXA-G, and NPXA-B.

A light emitting layer may be located on the first electrode layer. The light emitting layer may include the red, first green, and blue light emitting layers R_EL, G1_EL, and B_EL. The red, first green, and blue light emitting layers R_EL, G1_EL, and B_EL may be arranged in areas corresponding to the first to third openings OP1, OP2, and OP3, respectively. The red, first green, and blue light emitting layers R_EL, G1_EL, and B_EL may be separately formed in the red, first green, and blue pixels PXR, PXG1, and PXB (refer to FIG. 5B), respectively. Each of the red, first green, and blue light emitting layers R_EL, G1_EL, and B_EL may contain an organic material and/or an inorganic material. The red, first green, and blue light emitting layers R_EL, G1_EL, and B_EL may generate light beams having colors (e.g., set or predetermined colors). For example, the red light emitting layer R_EL may generate red light, the first green light emitting layer G1_EL may generate green light, and the blue light emitting layer B_EL may generate blue light.

Although the patterned red, first green, and blue light emitting layers R_EL, G1_EL, and B_EL are illustrated, one light emitting layer may be commonly arranged in the first to third emissive areas PXA-R, PXA-G, and PXA-B. In this case, the light emitting layer may generate white light or blue light. Furthermore, the light emitting layer may have a multi-layer structure called a tandem structure.

Each of the red, first green, and blue light emitting layers R_EL, G1_EL, and B_EL may contain a low molecular weight organic material or a high molecular weight organic material as a luminescent material. Alternatively, each of the red, first green, and blue light emitting layers R_EL, G1_EL, and B_EL may contain a quantum-dot material as a luminescent material. A core of a quantum dot may be selected from Group II-VI compounds, Group III-V compounds, Group IV-VI compounds, Group IV elements, Group IV compounds, and combinations thereof.

A second electrode layer is located on the light emitting layers R_EL, G1_EL, and B_EL. The second electrode layer may include the red, first green, and blue cathode electrodes R_CA, G1_CA, and B_CA. The red, first green, and blue cathode electrodes R_CA, G1_CA, and B_CA may be electrically connected with one another. According to some embodiments of the present disclosure, the red, first green, and blue cathode electrodes R_CA, G1_CA, and B_CA may be integrally formed. In this case, the red, first green, and blue cathode electrodes R_CA, G1_CA, and B_CA may be commonly arranged in the first to third emissive areas PXA-R, PXA-G, and PXA-B, the first to third non-emissive areas NPXA-R, NPXA-G, and NPXA-B, and the non-pixel area NPA.

The element layer DP_ED may further include the first and second light sensing elements OPD1 and OPD2 (refer to FIG. 4). Each of the first and second light sensing elements OPD1 and OPD2 may be a photo diode. For convenience of description, only the first light sensing element OPD1 is illustrated in FIG. 11A.

The pixel defining film PDL may further include a fourth opening OP4 provided to correspond to the light sensing element OPD1.

The first light sensing element OPD1 may include the first sub-anode electrode O_AE1, the first photoelectric conversion layer O_PCL1, and the first sub-cathode electrode O_CA1. The first sub-anode electrode O_AE1 may be located on the same layer as the first electrode layer. That is, the first sub-anode electrode O_AE1 may be located on the circuit layer DP_CL and may be simultaneously formed through the same process as the red, first green, and blue anode electrodes R_AE, G1_AE, and B_AE.

The fourth opening OP4 of the pixel defining film PDL exposes at least a portion of the first sub-anode electrode O_AE1. The first photoelectric conversion layer O_PCL1 is located on the first sub-anode electrode O_AE1 exposed by the fourth opening OP4. The first photoelectric conversion layer O_PCL1 may contain an organic photo sensing material. The first sub-cathode electrode O_CA1 may be located on the first photoelectric conversion layer O_PCL1. The first sub-cathode electrode O_CA1 may be simultaneously formed through the same process as the red, first green, and blue cathode electrodes R_CA, G1_CA, and B_CA. According to some embodiments of the present disclosure, the first sub-cathode electrode O_CA1 may be integrally formed with the red, first green, and blue cathode electrodes R_CA, G1_CA, and B_CA.

The first sub-anode electrode O_AE1 and the first sub-cathode electrode O_CA1 may each receive an electrical signal. The first sub-anode electrode O_AE1 and the first sub-cathode electrode O_CA1 may receive different signals. Accordingly, an electric field (e.g., a set or predetermined electric field) may be formed between the first sub-anode electrode O_AE1 and the first sub-cathode electrode O_CA1. The first photoelectric conversion layer O_PCL1 generates an electrical signal corresponding to light incident on the sensor FX (refer to FIG. 4). The first photoelectric conversion layer O_PCL1 may generate charges by absorbing energy of the incident light. For example, the first photoelectric conversion layer O_PCL1 may contain a photosensitive semiconductor material.

The charges generated in the first photoelectric conversion layer O_PCL1 change the electric field between the first sub-anode electrode O_AE1 and the first sub-cathode electrode O_CA1. The amount of charges generated in the first photoelectric conversion layer O_PCL1 may vary depending on whether light is incident on the first light sensing element OPD1 and the amount and intensity of light incident on the first light sensing element OPD1. Accordingly, the electric field formed between the first sub-anode electrode O_AE1 and the first sub-cathode electrode O_CA1 may vary. The first light sensing element OPD1 according to the present disclosure may obtain fingerprint information of the user through the change in the electric field between the first sub-anode electrode O_AE1 and the first sub-cathode electrode O_CA1.

However, this is illustrative, and the first light sensing element OPD1 may include a phototransistor with the first photoelectric conversion layer O_PCL1 as an active layer. In this case, the first light sensing element OPD1 may obtain fingerprint information by sensing the amount of current flowing through the phototransistor. The first light sensing element OPD1 according to some embodiments of the present disclosure may include various photoelectric conversion elements capable of generating an electrical signal in response to a change in the amount of light and is not limited to any one embodiment.

The encapsulation layer TFE is located on the element layer DP_ED. The encapsulation layer TFE includes at least an inorganic layer or an organic layer. According to some embodiments of the present disclosure, the encapsulation layer TFE may include two inorganic layers and an organic layer located therebetween. According to some embodiments of the present disclosure, the encapsulation layer TFE may include a plurality of inorganic layers and a plurality of organic layers that are alternately stacked one above another.

The inorganic encapsulation layers protect the red, first green, and blue light emitting elements ED_R, ED_G1, and ED_B and the first light sensing element OPD1 from moisture/oxygen, and the organic encapsulation layers protect the red, first green, and blue light emitting elements ED_R, ED_G1, and ED_B and the first light sensing element OPD1 from foreign matter such as dust particles. The inorganic encapsulation layers may include, but are not particularly limited to, a silicon nitride layer, a silicon oxy-nitride layer, a silicon oxide layer, a titanium oxide layer, or an aluminum oxide layer. The organic encapsulation layers may include, but are not particularly limited to, an acrylate-based organic layer.

The display device DD (refer to FIG. 1) includes the input sensing layer ISL located on the display panel DP, and the color filter layer CFL and the window WM located on the input sensing layer ISL.

The input sensing layer ISL may be directly arranged on the encapsulation layer TFE. The input sensing layer ISL includes a first conductive layer ICL1, an insulating layer IL, a second conductive layer ICL2, and a protective layer PL. The first conductive layer ICL1 may be located on the encapsulation layer TFE. Although FIGS. 11A and 11B illustrate the structure in which the first conductive layer ICL1 is directly located on the encapsulation layer TFE, embodiments according to the present disclosure are not limited thereto. The input sensing layer ISL may further include a base insulating layer located between the first conductive layer ICL1 and the encapsulation layer TFE. In this case, the encapsulation layer TFE may be covered by the base insulating layer, and the first conductive layer ICL1 may be located on the base insulating layer. According to some embodiments of the present disclosure, the base insulating layer may contain an inorganic insulating material.

The insulating layer IL may cover the first conductive layer ICL1. The second conductive layer ICL2 is located on the insulating layer IL. Although FIGS. 11A and 11B illustrate the structure in which the input sensing layer ISL includes the first and second conductive layers ICL1 and ICL2, embodiments according to the present disclosure are not limited thereto. For example, the input sensing layer ISL may include only one of the first and second conductive layers ICL1 and ICL2.

The protective layer PL may be located on the second conductive layer ICL2. The protective layer PL may contain an organic insulating material. The protective layer PL may serve to protect the first and second conductive layers ICL1 and ICL2 from moisture/oxygen and protect the first and second conductive layers ICL1 and ICL2 from foreign matter.

The color filter layer CFL may be located on the input sensing layer ISL. The color filter layer CFL may be directly located on the protective layer PL. The color filter layer CFL may include a first color filter CF_R, a second color filter CF_G, and a third color filter CF_B. The first color filter CF_R has a first color, the second color filter CF_G has a second color, and the third color filter CF_B has a third color. According to some embodiments of the present disclosure, the first color may be red, the second color may be green, and the third color may be blue.

The color filter layer CFL may further include a dummy color filter DCF. According to some embodiments of the present disclosure, the dummy color filter DCF may be arranged to correspond to the sensing area SA. The dummy color filter DCF may overlap the sensing area SA and the non-sensing area NSA. According to some embodiments of the present disclosure, the dummy color filter DCF may have the same color as one of the first to third color filters CF_R, CF_G, and CF_B. According to some embodiments of the present disclosure, the dummy color filter DCF may have the same green color as the second color filter CF_G.

The color filter layer CFL may further include a black matrix BM. The black matrix BM may be arranged to correspond to the non-pixel area NPA. The black matrix BM may be arranged to overlap the first and second conductive layers ICL1 and ICL2 in the non-pixel area NPA. According to some embodiments of the present disclosure, the black matrix BM may overlap the non-pixel area NPA and the first to third non-emissive areas NPXA-G, NPXA-B, and NPXA-R. The black matrix BM may not overlap the first to third emissive areas PXA-R, PXA-G, and PXA-B.

The color filter layer CFL may further include an over-coating layer OCL. The over-coating layer OCL may contain an organic insulating material. The over-coating layer OCL may have a thickness sufficient to remove steps between the first to third color filters CF_R, CF_G, and CF_B. Without any specific limitation, the over-coating layer OCL may contain any material that has a thickness (e.g., a set or predetermined thickness) and is capable of flattening the upper surface of the color filter layer CFL. For example, the over-coating layer OCL may contain an acrylate-based organic material.

The window WM may be located on the color filter layer CFL.

Referring to FIG. 11B, when the display device DD (refer to FIG. 1) operates, the red, first green, and blue light emitting elements ED_R, ED_G1, and ED_B may output light. The red light emitting elements ED_R output red light in a red wavelength band, the first green light emitting elements ED_G1 output green light in a green wavelength band, and the blue light emitting elements ED_B output blue light in a blue wavelength band. Hereinafter, components identical to the components described with reference to FIG. 11A will be assigned with identical reference numerals, and descriptions thereabout will be omitted.

According to some embodiments of the present disclosure, the first light sensing element OPD1 may receive light from specific light emitting elements (e.g., the first green light emitting elements ED_G1) among the red, first green, and blue light emitting elements ED_R, ED_G1, and ED_B. That is, second light Lg1 may be output from the first green light emitting elements ED_G1, and the first light sensing element OPD1 may receive second reflected light Lg2 obtained by reflection of the second light Lg1 by the user's fingerprint. The second light Lg1 and the second reflected light Lg2 may be green light in the green wavelength band. The dummy color filter DCF is arranged over the first light sensing element OPD1. The dummy color filter DCF may be green in color. Accordingly, the second reflected light Lg2 may pass through the dummy color filter DCF and may be incident on the first light sensing element OPD1.

Meanwhile, red light and blue light output from the red and blue light emitting elements ED_R and ED_B may also be reflected by the user's hand US_F. For example, when light obtained by reflection of red light Lr1 output from the red light emitting elements ED_R by the user's hand US_F is defined as first reflected light Lr2, the first reflected light Lr2 fails to pass through the dummy color filter DCF and may be absorbed by the dummy color filter DCF. Accordingly, the first reflected light Lr2 fails to pass through the dummy color filter DCF and cannot be incident on the first light sensing element OPD1. Likewise, even though blue light is reflected by the user's hand US_F, the blue light may be absorbed by the dummy color filter DCF. Accordingly, only the second reflected light Lg2 may be provided to the first light sensing element OPD1.

According to some embodiments of the present disclosure, the scan line supplying the scan signal to the pixels and the sensing control line supplying the sensing control signal different from the scan signal to the sensors may be located on the same layer. Accordingly, the sensors may be controlled irrespective of the scan signal. As a result, the sensing performance of the sensors may be improved, and the improvement in the sensing performance may be achieved without addition of a separate manufacturing process.

While the present disclosure has been described with reference to embodiments thereof, it will be apparent to those of ordinary skill in the art that various changes and modifications may be made thereto without departing from the spirit and scope of the present disclosure as set forth in the following claims, and their equivalents.

What is claimed is:

1. A display device comprising:
   a base layer;
   a plurality of write scan lines configured to sequentially receive write scan signals, the plurality of write scan lines being on the base layer;
   a plurality of pixels on the base layer and connected to the plurality of write scan lines, respectively;
   a plurality of sensing control lines configured to simultaneously receive sensing control signals, the sensing control lines being on the base layer; and
   a plurality of sensors on the base layer and connected to the plurality of sensing control lines and the plurality of write scan lines, respectively,
   wherein each of the sensors includes:
   a light sensing unit; and
   a sensor drive circuit on the base layer and electrically connected with the light sensing unit, the sensor drive circuit being configured to receive a sensing control signal from among the sensing control signals through a sensing control line from among the sensing control lines and a write scan signal from among the write scan signals through a write scan line from among the write scan lines,
   wherein the sensor drive circuit includes:
   a reset transistor including a first electrode connected with a reset receiving line configured to receive a reset voltage, a second electrode connected with a first sensing node, and a third electrode connected with the sensing control line;
   an amplifying transistor including a first electrode connected with a sensing drive line configured to receive a sensing drive voltage, a second electrode connected with a second sensing node, and a third electrode connected with the first sensing node; and
   an output transistor including a first electrode connected with the second sensing node, a second electrode connected with a sensing line, and a third electrode connected with the write scan line configured to receive the write scan signal, and wherein the reset transistor is an oxide semiconductor.

2. The display device of claim 1, wherein each of the pixels includes:
a light emitting element; and
a pixel drive circuit on the base layer and electrically connected with the light emitting element, the pixel drive circuit being configured to receive the write scan signal through the write scan line.

3. The display device of claim 2, further comprising:
a plurality of compensation scan lines configured to sequentially receive a plurality of compensation scan signals, the plurality of compensation scan lines being on the base layer,
a plurality of initialization scan lines configured to sequentially receive a plurality of initialization scan signals, the plurality of initialization scan lines being on the base layer, and
a plurality of black scan lines configured to sequentially receive a plurality of black scan signals.

4. The display device of claim 3, wherein a compensation scan line from among the compensation scan lines and a sensing control line from among the sensing control lines are on a same layer.

5. The display device of claim 4, wherein the pixel drive circuit includes:
a drive transistor including a first electrode connected with a first drive voltage line configured to receive a first drive voltage, a second electrode connected with the light emitting element, and a third electrode connected with a first reference node;
a switching transistor including a first electrode connected with a data line configured to receive a data signal, a second electrode connected with the first electrode of the drive transistor, and a third electrode connected with the write scan line configured to receive the write scan signal;
a compensation transistor including a first electrode connected with the second electrode of the drive transistor, a second electrode connected with the first reference node, and a third electrode connected with the compensation scan line configured to receive a compensation scan signal from among the compensation scan signals; and
an initialization transistor including a first electrode connected with the first reference node, a second electrode connected with a first initialization line configured to receive a first initialization voltage, and a third electrode configured to receive an initialization scan signal from among the initialization scan signals through an initialization scan line from among the initialization scan lines.

6. The display device of claim 5, wherein each of the compensation transistor and the initialization transistor is an oxide semiconductor.

7. The display device of claim 5,
wherein the pixel drive circuit further includes:
a black scan transistor including a first electrode connected with a second initialization line configured to receive a second initialization voltage, a second electrode connected with the light emitting element, and a third electrode configured to receive a black scan signal from among the black scan signals through a black scan line from among the black scan lines.

8. The display device of claim 7, wherein the second initialization voltage and the reset voltage have same voltage.

9. The display device of claim 5, wherein the pixel drive circuit and the sensor drive circuit are spaced apart from each other in a plan view.

10. The display device of claim 9, wherein the reset receiving line extends in a first direction and is on a different layer from the compensation scan line and the sensing control line.

11. The display device of claim 10, wherein the reset receiving line includes:
a first reset line extending in the first direction; and
a second reset line electrically connected with the first reset line and extending in a second direction,
wherein the first reset line is on a same layer as the first drive voltage line, and
wherein the second reset line is on a same layer as the data line.

12. The display device of claim 2, wherein the light sensing unit includes k light sensing elements,
wherein each of the k light sensing elements includes:
a first anode electrode;
a photoelectric conversion layer on the first anode electrode; and
a first cathode electrode on the photoelectric conversion layer,
wherein the sensor drive circuit is directly connected to the first anode electrode of one light sensing element, and
wherein k is a natural number of 2 or larger.

13. The display device of claim 12, wherein each of the sensors further includes a routing wire configured to electrically connect the k light sensing elements, and
wherein the routing wire electrically connects k anode electrodes of the k light sensing elements to each other.

14. The display device of claim 12, wherein the light emitting element includes:
a second anode electrode electrically connected with the second electrode of a drive transistor of the pixel drive circuit;
a light emitting layer on the second anode electrode; and
a second cathode electrode on the light emitting layer,
wherein the second cathode electrode is electrically connected with first cathode electrodes of the k light sensing elements, and
wherein the first anode electrode of the one light sensing element is directly connected with the first sensing node.

15. An electronic device comprising:
a display panel; and
a housing having an inner space for accommodating the display panel,
wherein the display panel comprising:
a base layer;
a plurality of write scan lines configured to sequentially receive write scan signals, the plurality of write scan lines being on the base layer;
a plurality of pixels on the base layer and connected to the plurality of write scan lines, respectively;
a plurality of sensing control lines configured to simultaneously receive sensing control signals, the sensing control lines being on the base layer; and
a plurality of sensors on the base layer and connected to the plurality of sensing control lines and the plurality of write scan lines, respectively, wherein each of the sensors includes:

a light sensing unit; and a sensor drive circuit on the base layer and electrically connected with the light sensing unit, the sensor drive circuit being configured to receive a sensing control signal from among the sensing control signals through a sensing control line from among the sensing control lines and a write scan signal from among the write scan signals through a write scan line from among the write scan lines, wherein the sensor drive circuit includes:

a reset transistor including a first electrode connected with a reset receiving line configured to receive a reset voltage, a second electrode connected with a first sensing node, and a third electrode connected with the sensing control line;

an amplifying transistor including a first electrode connected with a sensing drive line configured to receive a sensing drive voltage, a second electrode connected with a second sensing node, and a third electrode connected with the first sensing node; and an output transistor including a first electrode connected with the second sensing node, a second electrode connected with a sensing line, and a third electrode connected with the write scan line configured to receive the write scan signal.

16. The electronic device of claim 15, wherein each of the pixels includes:

a light emitting element; and a pixel drive circuit on the base layer and electrically connected with the light emitting element, the pixel drive circuit being configured to receive the write scan signal through the write scan line.

17. The electronic device of claim 16, wherein the pixel drive circuit includes:

a drive transistor including a first electrode connected with a first drive voltage line configured to receive a first drive voltage, a second electrode connected with the light emitting element, and a third electrode connected with a first reference node;

a switching transistor including a first electrode connected with a data line configured to receive a data signal, a second electrode connected with the first electrode of the drive transistor, and a third electrode connected with the write scan line configured to receive the write scan signal;

a compensation transistor including a first electrode connected with the second electrode of the drive transistor, a second electrode connected with the first reference node, and a third electrode connected with a compensation scan line configured to receive a compensation scan signal from among the compensation scan signals; and a black scan transistor including a first electrode connected with an initialization line configured to receive an initialization voltage, a second electrode connected with the light emitting element, and a third electrode connected with receive a black scan signal from among the black scan signals through a black scan line from among the black scan lines.

18. The electronic device of claim 17, wherein the initialization voltage and the reset voltage have a same voltage.

19. The electronic device of claim 17, wherein each of the reset transistor and the compensation transistor is an oxide semiconductor.

* * * * *